US008297744B2

(12) United States Patent
Hayashi et al.

(10) Patent No.: US 8,297,744 B2
(45) Date of Patent: Oct. 30, 2012

(54) FUNCTIONAL LIQUID SUPPLY APPARATUS, LIQUID DROPLET EJECTION APPARATUS, METHOD OF MANUFACTURING ELECTRO-OPTICAL APPARATUS, ELECTRO-OPTICAL APPARATUS AND ELECTRONIC APPARATUS

(75) Inventors: Takayuki Hayashi, Shimosuwa (JP); Yasuhiko Asano, Chino (JP)

(73) Assignee: Seiko Epson Corporation (JP)

( * ) Notice: Subject to any disclaimer, the term of this patent is extended or adjusted under 35 U.S.C. 154(b) by 1259 days.

(21) Appl. No.: 12/077,709

(22) Filed: Mar. 20, 2008

(65) Prior Publication Data

US 2008/0239029 A1 Oct. 2, 2008

(30) Foreign Application Priority Data

Mar. 29, 2007 (JP) ................................ 2007-089249

(51) Int. Cl.
*B41J 2/175* (2006.01)

(52) U.S. Cl. ......................................... 347/85; 137/111

(58) Field of Classification Search .................... 347/85; 438/30; 257/72; 137/111
See application file for complete search history.

(56) References Cited

U.S. PATENT DOCUMENTS 4,067,020 A * 1/1978 Arway ............................ 347/7
4,149,172 A * 4/1979 Heinzl et al. .................... 347/92
5,485,187 A * 1/1996 Okamura et al. ............... 347/85
6,059,405 A * 5/2000 Mochizuki et al. ............. 347/92
6,218,916 B1 * 4/2001 Ishikawa et al. .............. 333/254
6,276,784 B1 * 8/2001 Ikkatai et al. .................. 347/85
6,281,916 B1 * 8/2001 VanSteenkiste ................ 347/85
6,296,008 B1 * 10/2001 Boyer et al. .................. 137/113
6,536,885 B2 * 3/2003 Kuribayashi et al. ........... 347/85
6,663,233 B2 * 12/2003 Otsuka et al. .................. 347/85
6,840,604 B2 * 1/2005 Kimura et al. .................. 347/85
6,883,905 B2 * 4/2005 Kimura et al. .................. 347/85
7,077,513 B2 * 7/2006 Kimura et al. .................. 347/85
7,097,290 B2 * 8/2006 Yoshida .......................... 347/85
7,261,399 B2 * 8/2007 Miki .............................. 347/85
7,467,858 B2 * 12/2008 Lebron et al. .................. 347/85
2001/0020970 A1 * 9/2001 Kuribayashi et al. ........... 347/85
2002/0075364 A1 * 6/2002 Takahashi et al. .............. 347/85
2002/0080215 A1 * 6/2002 Sakaida et al. .................. 347/71
2002/0113852 A1 * 8/2002 Kimura et al. .................. 347/85
2002/0142454 A1 * 10/2002 Cracauer et al. ........... 435/287.2
2003/0210309 A1 * 11/2003 Kimura et al. .................. 347/85
2004/0100538 A1 * 5/2004 Taniguchi et al. .............. 347/86
(Continued)

FOREIGN PATENT DOCUMENTS

JP 55073565 A * 6/1980
JP 06-071724 3/1994
JP 10-128506 5/1998
JP 11-042771 2/1999
(Continued)

*Primary Examiner* — Charlie Peng
*Assistant Examiner* — Peter Radkowski
(74) *Attorney, Agent, or Firm* — Harness, Dickey & Pierce, P.L.C.

(57) ABSTRACT

Provided herein is a functional liquid supply apparatus having: a plurality of sub tanks, a tank unit which replenishes the functional liquid to the plurality of sub tanks, an upstream side functional liquid channel of which an upstream side thereof is connected to the tank unit and a downstream side thereof is connected to each of the sub tanks, and a plurality of third opening and closing valves which replenish the functional liquid to each of the sub tanks by its' opening and closing operations. The tank unit 122 has a pair of main tanks, nitrogen gas supply units connected to the pair of the main tanks respectively, and a switching device which is capable of switching a pressurized liquid of the functional liquid fed from the pair of the main tanks alternatively.

16 Claims, 28 Drawing Sheets

U.S. PATENT DOCUMENTS

2004/0135829 A1* 7/2004 Yoshida ............................ 347/7
2004/0141023 A1* 7/2004 Nakamura ...................... 347/30
2005/0035985 A1 2/2005 Taguchi et al.
2005/0045096 A1* 3/2005 Kojima ......................... 118/323
2005/0062815 A1* 3/2005 Yoshihira et al. ............... 347/89
2005/0270341 A1* 12/2005 Yamamoto et al. ............. 347/85
2007/0052763 A1* 3/2007 Takatsuka ....................... 347/68
2008/0238957 A1* 10/2008 Hayashi ............................ 347/7

FOREIGN PATENT DOCUMENTS

JP 2002120374 A * 4/2002
JP 2004-167294 6/2004
JP 2004-167326 6/2004
JP 2004-167430 6/2004
JP 2006-069138 3/2006
JP 2006-085667 3/2006
JP 2006069138 A * 3/2006

* cited by examiner

X-axis direction
1
2
3
4
5
11
12
13
14
15
16
17
18
21
(31)
22
23
24
32
51
52
53
61
62
71
72
77
78
W 101
17
17
17
127
127
127
148
147
146
150
149
86
87
121
121
121
85
139
133
133
132
138
86
157
155
136
135
86
137
89
135
126
156
158
6
131
181
186
189
87
86
188
187
183
122
182
182
85
181

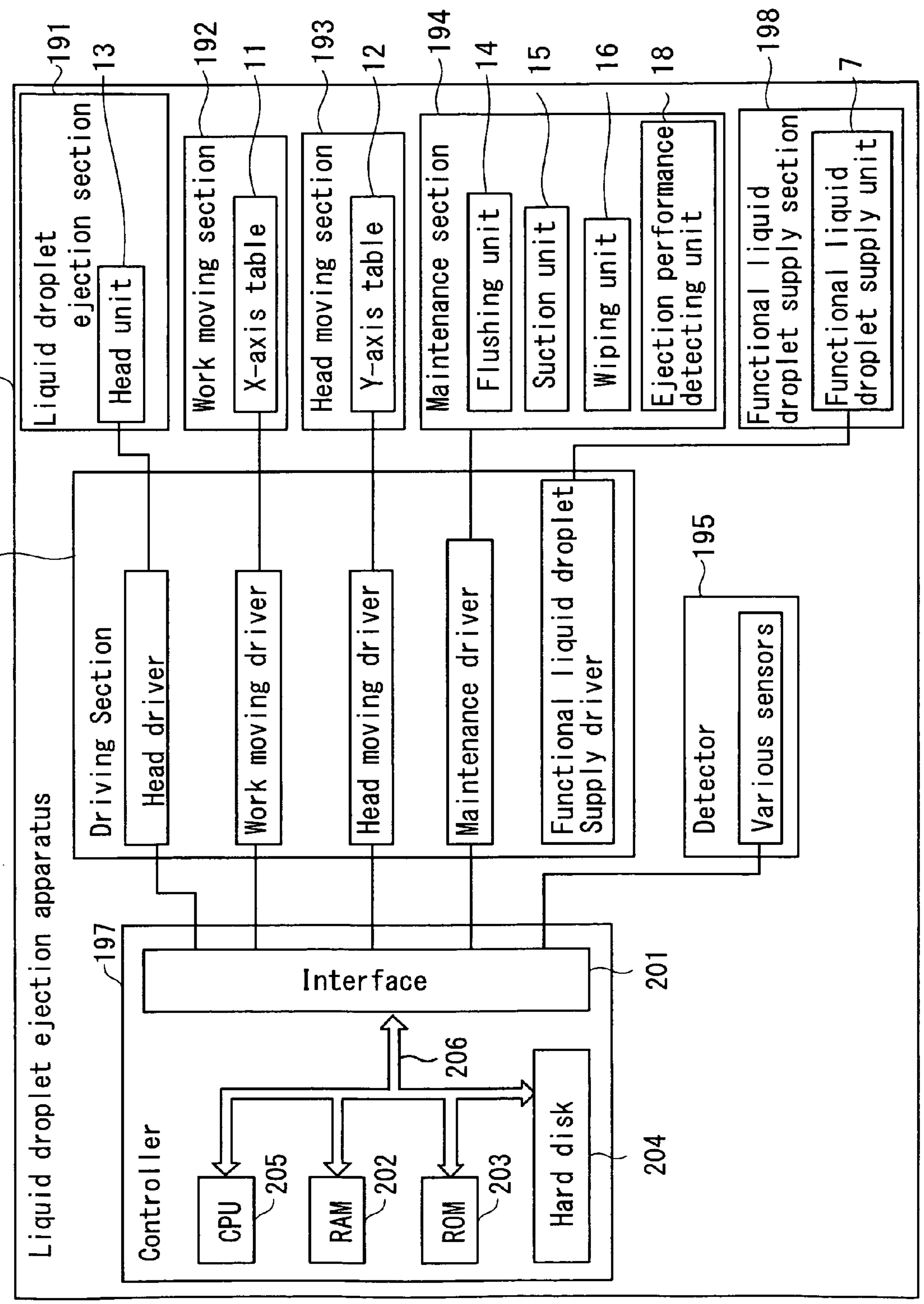
Fig. 10
Liquid droplet ejection apparatus
1
Liquid droplet ejection section
191
Head unit
13
Work moving section
192
X-axis table
11
Head moving section
193
Y-axis table
12
Maintenance section
194
Flushing unit
14
Suction unit
15
Wiping unit
16
Ejection performance detecting unit
18
Functional liquid droplet supply section
198
Functional liquid droplet supply unit
7
Driving Section
196
Head driver
Work moving driver
Head moving driver
Maintenance driver
Functional liquid droplet Supply driver
Detector
195
Various sensors
Controller
197
Interface
201
206
CPU
205
RAM
202
ROM
203
Hard disk
204

520
500
523
524
522
527
526
521
507b
503
502
509
508B
508G
508R
501
528
529
523
523a
B
G
R
B
G
R 600
611b
611a
608
606
615
613
617
B
618
G
618t
618b
618a
619
617a
617b
R
614
609
612a
612b
607b
607c
607a
607
604
603
602
601

F I G. 1 7
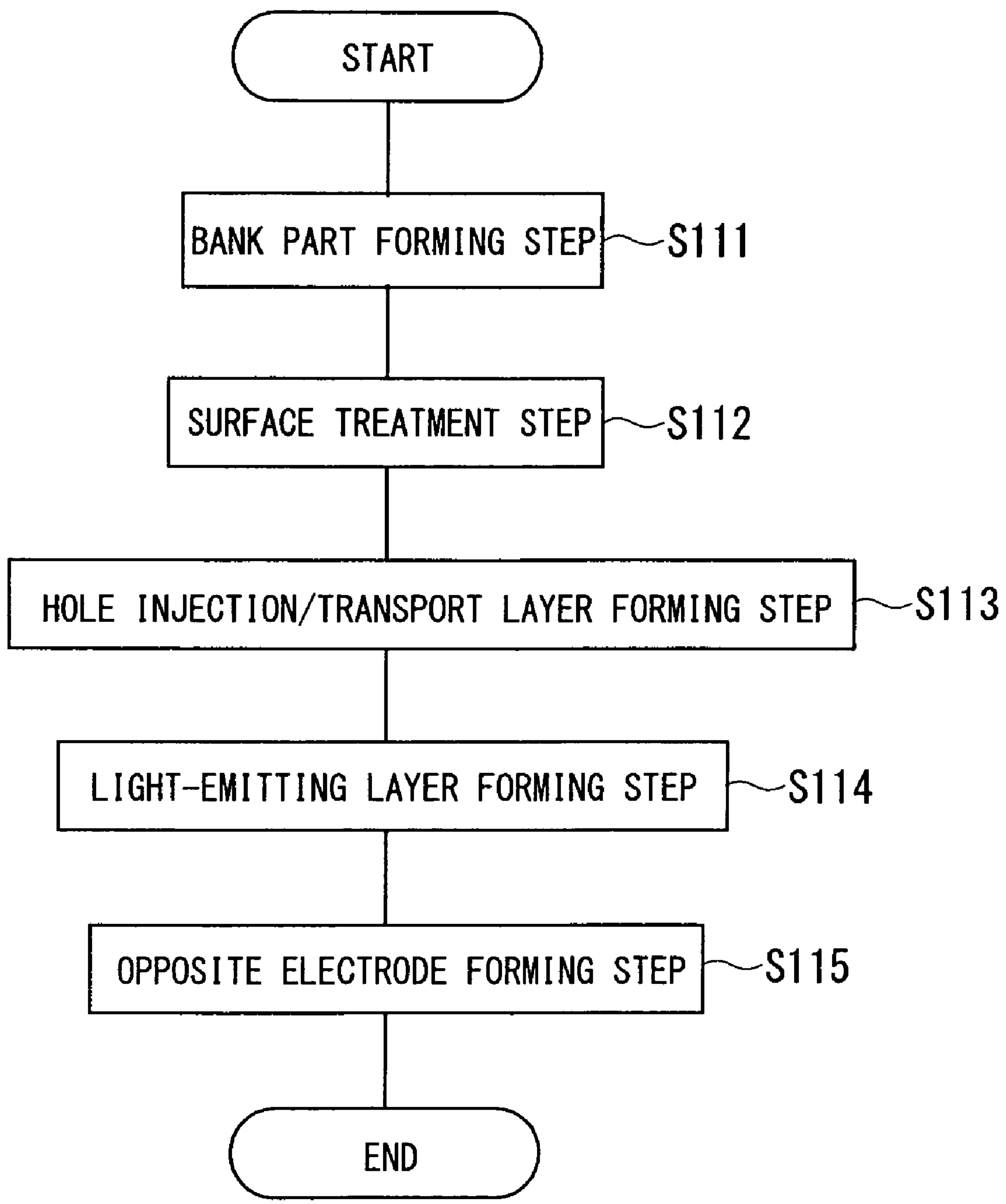

F I G. 1 9
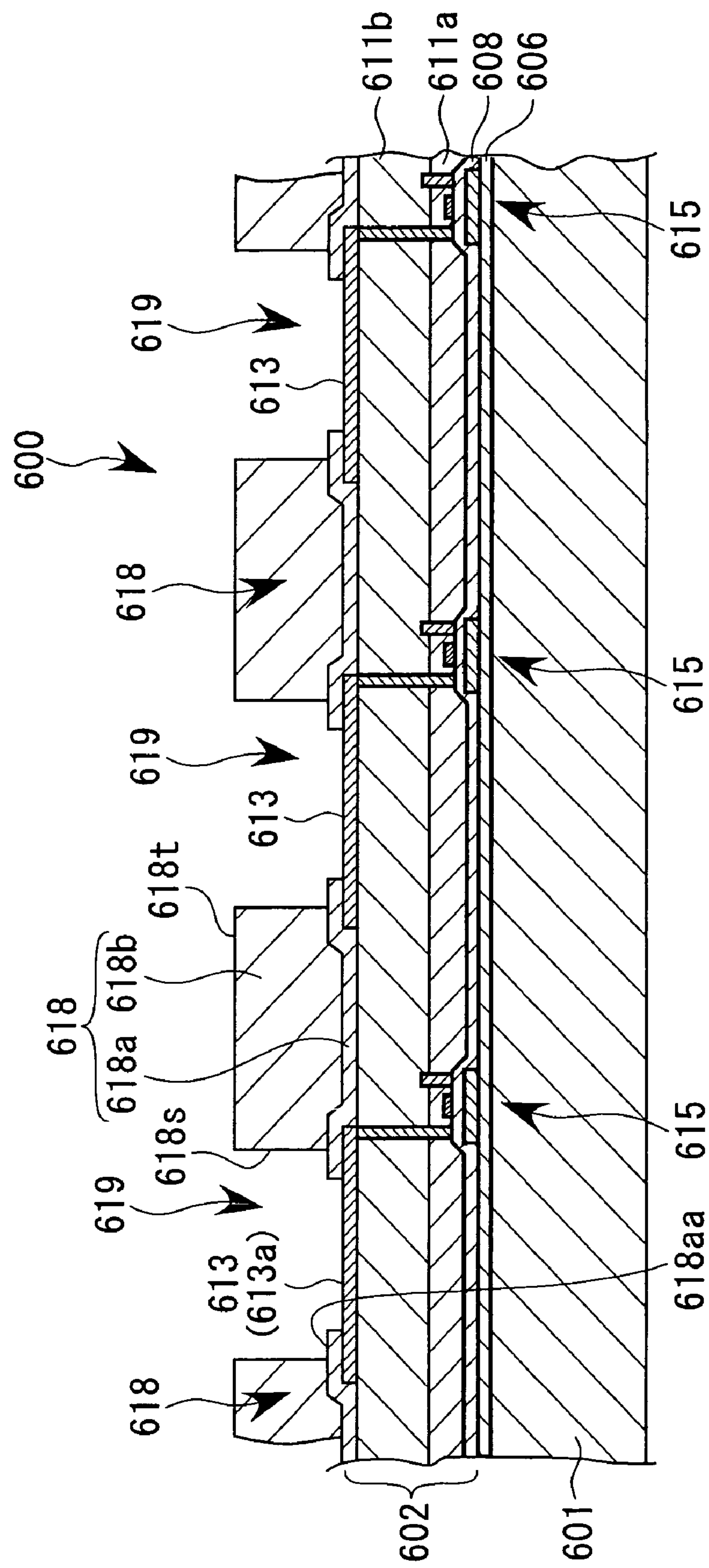

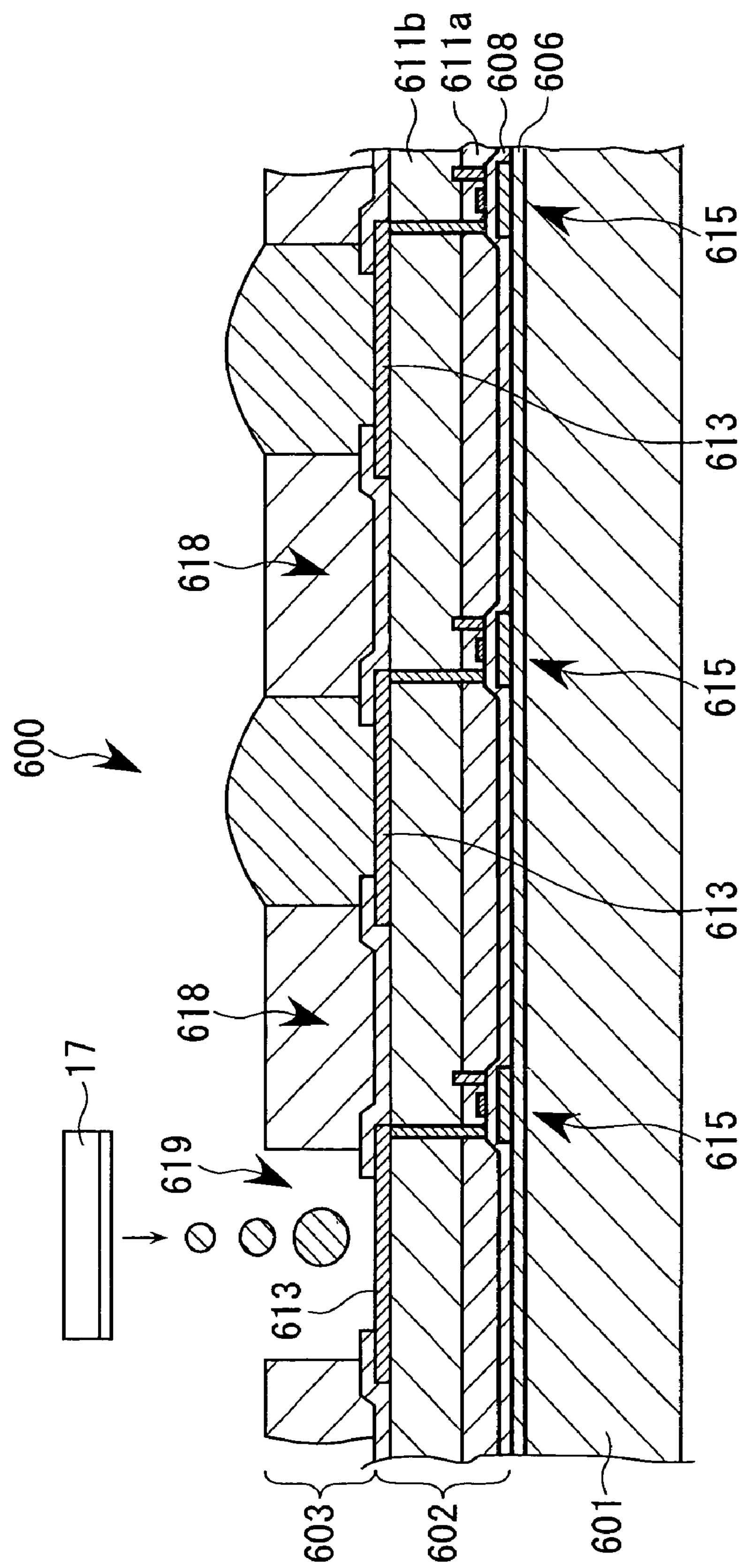
F I G. 2 0
600
611b
611a
608
606
615
613
618
619
17
603
602
601

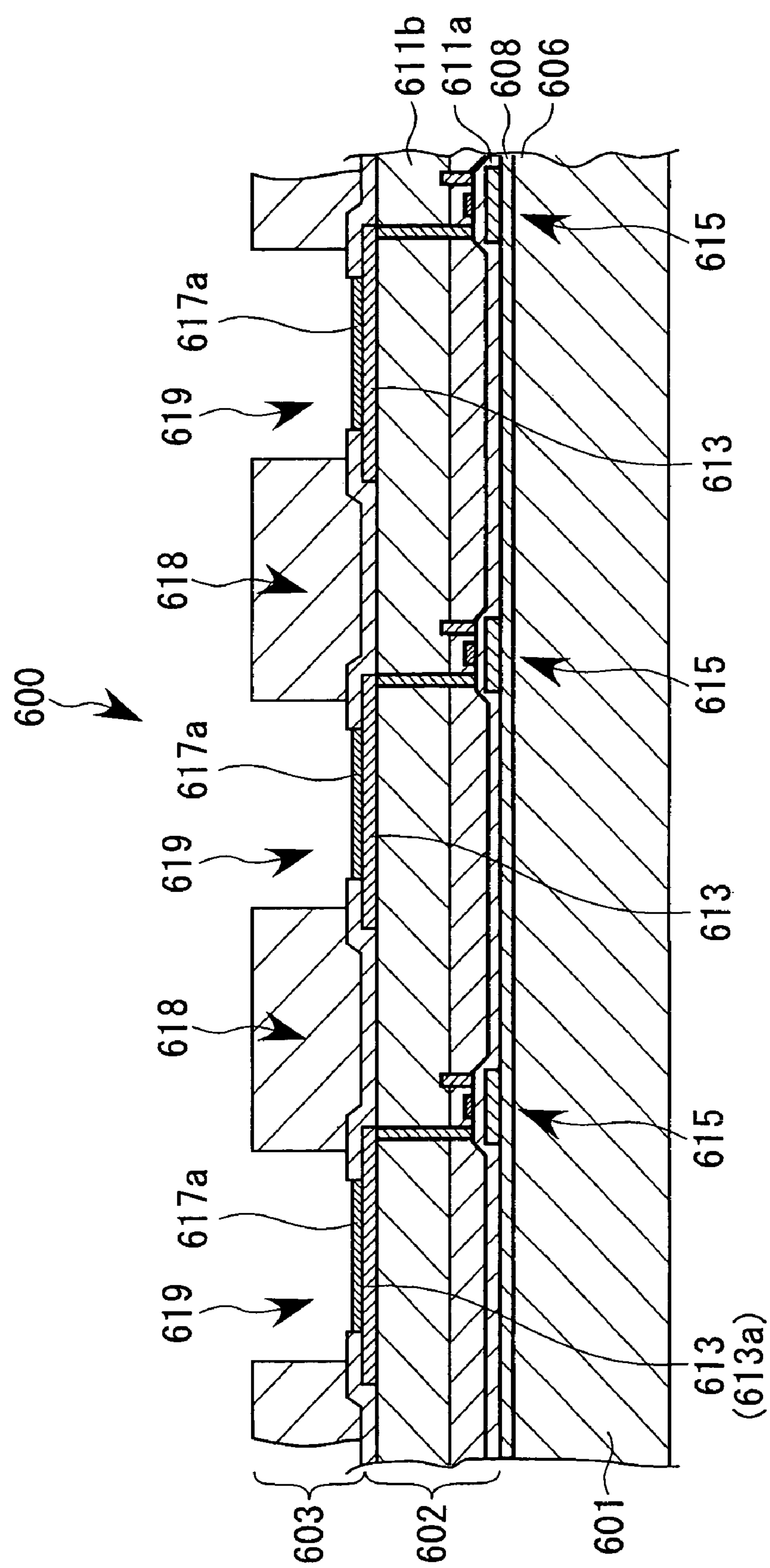
F I G. 2 1
600
611b
611a
608
606
615
615
615
617a
617a
617a
619
619
619
618
618
613
613
613
(613a)
603
602
601

600
611b
611a
608
606
615
617a
B
613
618
603
602
601

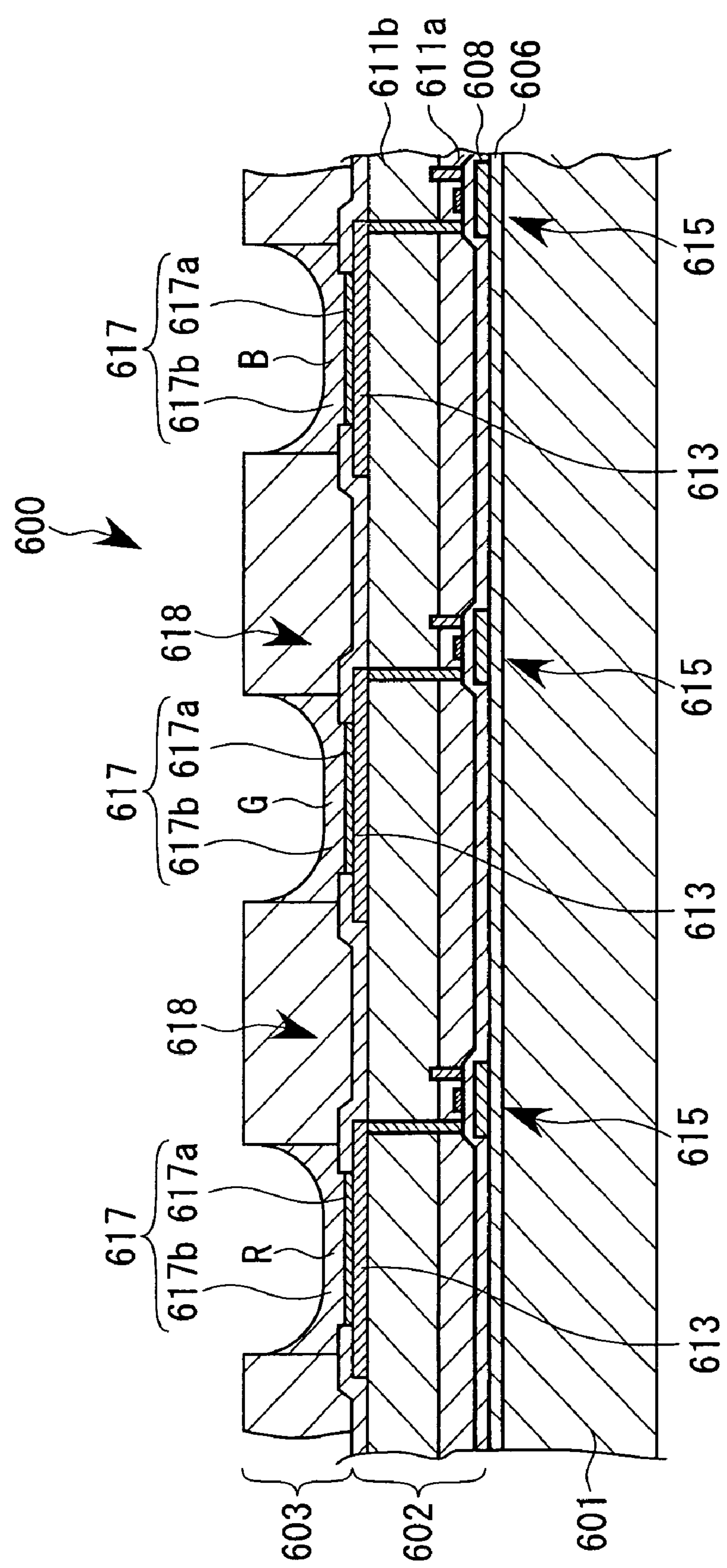
F I G. 2 4
600
611b
611a
608
606
615
615
615
613
613
613
617
617b
617a
B
G
R
618
618
603
602
601

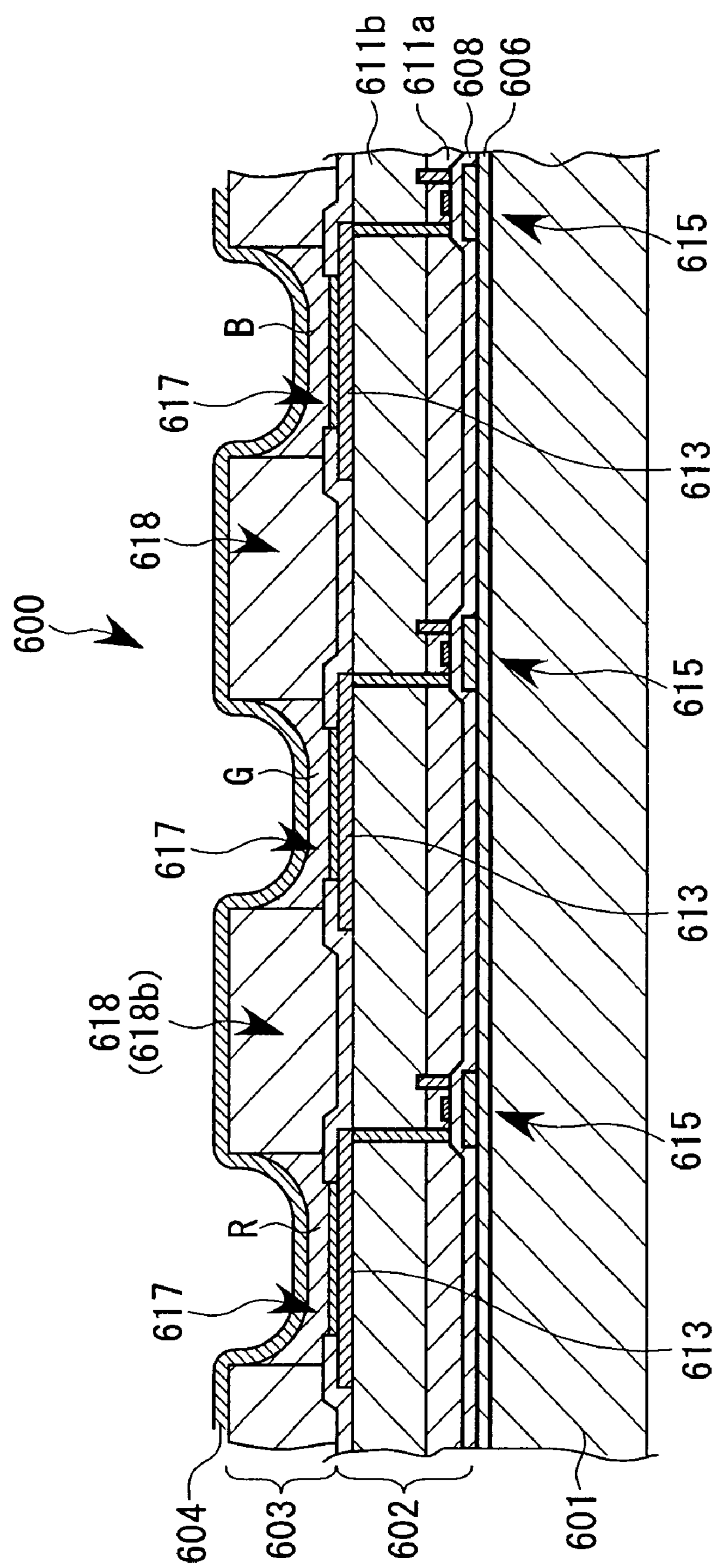
F I G. 2 5
600
611b
611a
608
606
615
617
618
(618b)
B
G
R
613
604
603
602
601

F I G. 2 6
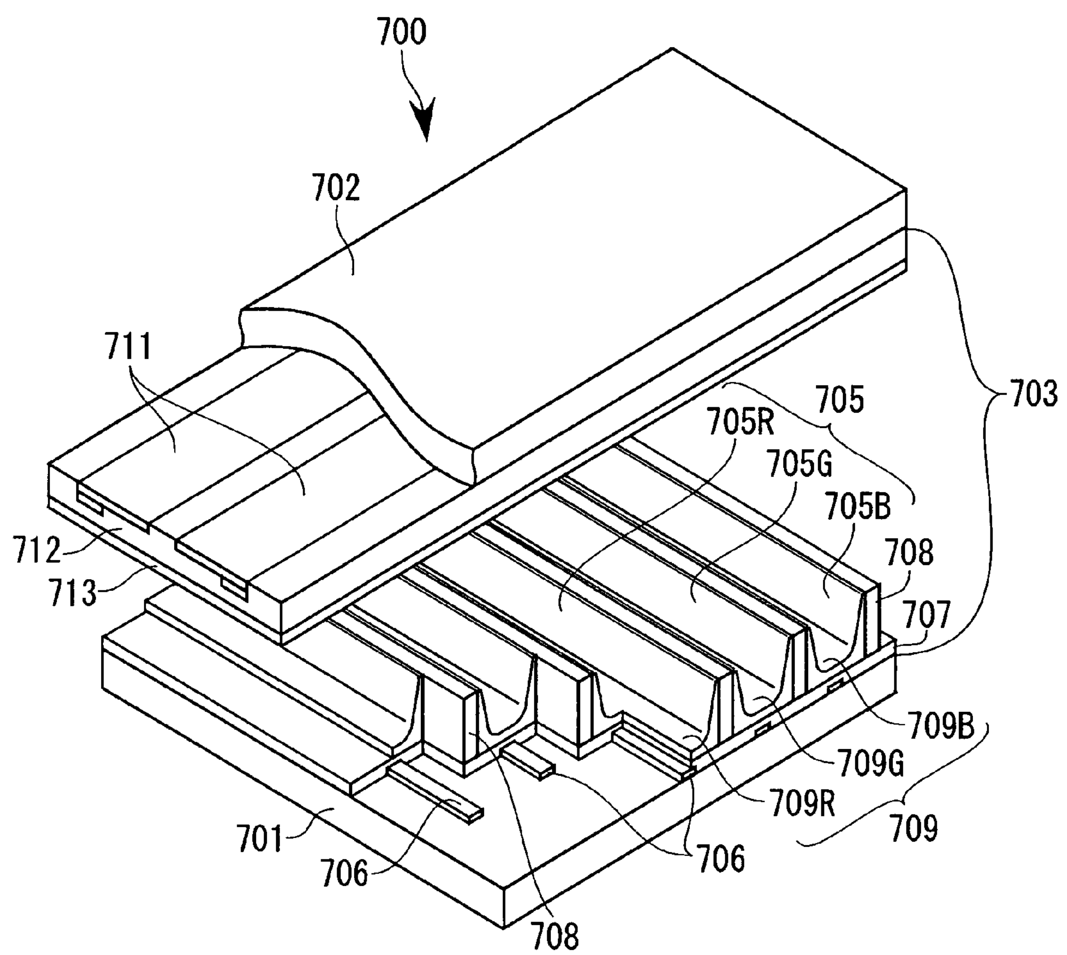

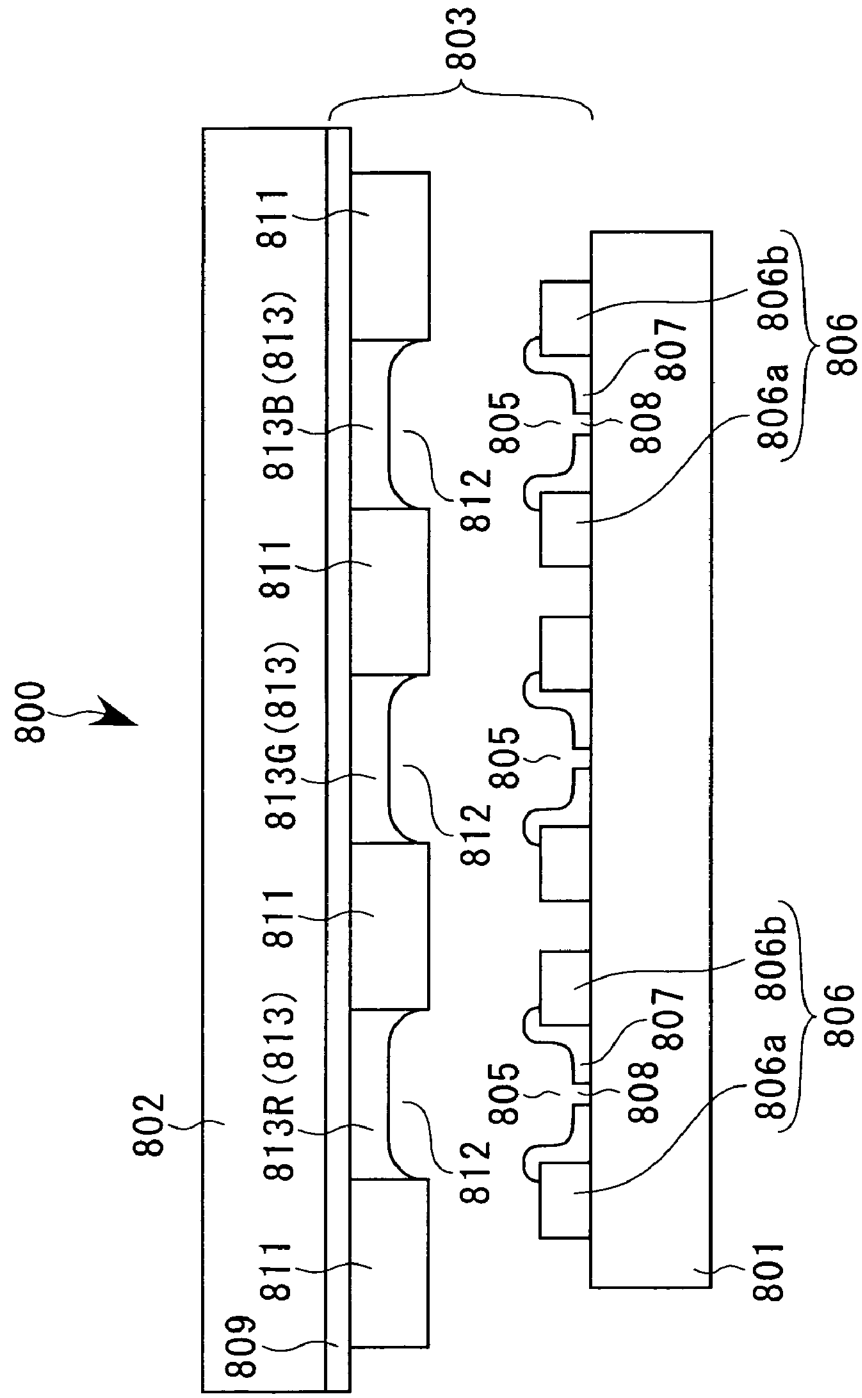
F I G. 2 7
800
803
811
813B (813)
812
813G (813)
813R (813)
802
809
805
808
807
806b
806a
806
801

FUNCTIONAL LIQUID SUPPLY APPARATUS, LIQUID DROPLET EJECTION APPARATUS, METHOD OF MANUFACTURING ELECTRO-OPTICAL APPARATUS, ELECTRO-OPTICAL APPARATUS AND ELECTRONIC APPARATUS

The entire disclosure of Japanese Patent Application No. 2007-089249, filed Mar. 29, 2007, is expressly incorporated by reference herein.

BACKGROUND

1. Technical Field

The present invention relates to a functional liquid supply apparatus which supplies liquid droplets to a functional liquid droplet ejection heads of a liquid droplet ejection apparatus, a liquid droplet ejection apparatus, a method of manufacturing an electro-optical apparatus, an electro-optical apparatus and an electronic apparatus.

2. Related Art

Conventionally, as this kind of a functional liquid supply apparatus, there is known the functional liquid supply apparatus having: sub tanks which store functional liquid supplied to functional liquid droplet ejection heads; a single main tank which replenishes the functional liquid to the sub tanks; ink tubes which connect the main tank with the sub tanks; and a liquid feeding device. The liquid feeding device is constructed by pumps and valves and the like, feeds the functional liquid between each of the tanks through the ink tubes, and controls the liquid to be fed. JP A-1999-42771 is an example of related art. When the functional liquid is ejected from the functional liquid droplet ejection heads and the functional liquid stored in the sub tank reduces, the functional liquid is replenished from the main tank to the sub tanks.

However, in such the functional liquid supply apparatus described above, in some cases, it is necessary to change main tanks when the functional liquid reduces therein at a state that a replenishment signal from the sub tanks is received. In this case, when a plotting process is continued, the functional liquid in the sub tanks is empty and the functional liquid droplet ejection heads may be in an idle ejection. Therefore, it is necessary to stop the plotting process and to change main tanks. In other words, in a single main tank construction, when the main tank needs to be changed, the plotting process must be stopped, leading to a lower productivity.

SUMMARY

An advantage of some aspects of the invention is to provide a functional liquid supply apparatus, a liquid droplet ejection apparatus without a need to stop a plotting process by functional liquid droplet ejection heads when changing main tanks, a method of manufacturing an electro-optical apparatus, an electro-optical apparatus and an electronic apparatus.

According to one aspect of the invention, there is provided a functional liquid supply apparatus comprising: a plurality of sub tanks which supply functional liquid to a plurality of ink jet type functional liquid droplet ejection heads via a head side channel respectively, a tank unit which replenishes the functional liquid to the plurality of sub tanks by pressurized liquid feeding, a functional liquid channel having a main channel of which an upstream side is connected to the tank unit, a branch channel of which an upstream side is connected to the main channel, and a plurality of branching channels of which an upstream side is connected to the branch channel and a downstream side is connected to each of the sub tanks, and a plurality of branching channel opening and closing devices which is provided on each of the branching channels and replenishes the pressurized functional liquid fed from the tank unit to each of the sub tanks by opening and closing action, wherein the tank unit includes a pair of main tanks which stores the functional liquid, a liquid pressurizing and feeding device connected to the pair of the main tanks, and a switching device of which an upstream side is connected to the pair of the main tanks and a downstream side is connected to the main channel, and which is capable of switching the pressurized liquid of the functional liquid fed from the pair of the main tanks alternatively.

According to this configuration, when the functional liquid in one of the main tanks is empty, one of the main tanks is changed, while the other of the main tanks can supply the functional liquid by switching tanks with the switching device. In this case, main tanks can be changed without stopping a replenishment of the functional liquid to each of the sub tanks. Therefore, a productivity is increased without stopping a plotting process by the functional liquid droplet ejection heads.

In this case, it is preferable that each of the branching channel opening and closing device is constructed with an air-operated valve which is capable of opening and closing each of the branching channels without changing a volume therein.

According to this configuration, it is possible to stop pulsations of the functional liquid occurred when each of the branching channel opening and closing device is opened and closed. Therefore, pulsations can not be transmitted to the functional liquid droplet ejection head and poor ejections from the functional liquid droplet ejection head can be avoided. Also, a temperature increase of the functional liquid passing through valves can be avoided by using the air-operated valve.

In this case, it is preferable that each of the sub tanks is disposed at a position above the corresponding functional liquid droplet ejection head, a decompression valve is provided on each of the head side main channels, the decompression valve operating at an atmosphere pressure criteria and retaining a head pressure between the corresponding functional liquid droplet ejection head within a predetermined allowable range.

According to this configuration, it is possible to manage a head pressure of the functional liquid precisely at a nozzle surface of the functional liquid droplet ejection head by using the decompression valve.

In this case, it is preferable that a liquid level controlling device is further provided, which controls a liquid level of the functional liquid in each of the sub tanks in a replenishing at a center position of an upper and a lower directions.

According to this configuration, it is possible to have a plenty of space (gaseous volume) in which the functional liquid is not filled in the sub tanks all the time. Therefore, the pulsations of the functional liquid occurred at an upstream side of the sub tanks can be absorbed, leading to further avoiding poor ejections from the functional liquid droplet ejection head.

In this case, it is preferable that a bubble elimination device is further provided on the main channel which eliminates micro bubbles in the functional liquid.

According to this configuration, it is possible to avoid a generation of a large bubble with micro bubbles in the functional liquid. In this case, the functional liquid containing bubbles can not reach to the sub tank and a false detection for a liquid level in the sub tank caused by bubbles can be avoided. Therefore, an adjustment of the liquid level in the sub tank can be performed accurately and the head pressure of the functional liquid droplet ejection head can be held at stable, whereby the poor ejections from the functional liquid droplet ejection head can further be avoided.

In this case, it is preferable that an air-drawn device provided on an end of the downstream side of the main channel and an air-drawn channel connected to the air-drawn device are further provided.

According to this configuration, when the functional liquid is filled in the functional liquid supply apparatus in an initial filling, unnecessary air can be drawn out properly. Therefore, unnecessary air can be easily eliminated at the time of the initial filling.

In this case, a sub pressurizing device which is connected to each of the sub tanks and is capable of pressurizing within each of the sub tanks, a head channel opening and closing device which is provided on each of the head side channels and is capable of opening and closing therefor, an upper limit detection device which detects the liquid level at which the functional liquid reaches at an upper limit of each of the sub tanks, and a liquid feeding control device which controls the liquid pressurizing and feeding device, each of the sub pressurizing devices, each of the branching channel opening and closing devices and each of the head channel opening and closing devices are further provided. The liquid feeding control device, when the upper limit detection device detects the liquid level at which the functional liquid reaches the upper limit of each of the sub tanks, makes the branching channel opening and closing device open, makes the head channel opening and closing device closed, releases a pressure of the liquid pressurizing and feeding device, and feeds the functional liquid of the sub tank reversely to the main tank by driving the sub pressurizing device.

According to this configuration, when the functional liquid is filled beyond an upper limit at which the functional liquid overflows by a sensor which breaks down and is supposed to detect a normal liquid level, it is possible to return some functional liquid by feeding the filled functional liquid reversely. Therefore, it is possible to abandon the functional liquid overly supplied to the sub tank and to deal with it properly. It is also possible to stop an operation of the apparatus.

In this case, it is preferable that the branch channel is constructed with a two-branch joint and a pair of connecting short pipes, which is repeated a plurality of stages from an upstream side end to a downstream side end, and of which an upstream side thereof is set to a bottom and a downstream side thereof is set to a top.

According to this configuration, it is possible to construct the apparatus simply so as to keep pressure losses and flow rate (flow amount) steadily and to construct a plurality of simple branch constructions. Also, by setting an upstream side thereof to a bottom and a downstream side thereof to a top, the functional liquid flows from the bottom to the top. It avoids air remaining in the branch channel.

In this case, it is preferable that the branch channel, when a fractional portion remains at a most downstream stage, adjusts a pressure loss by a pipe length between the pair of the connecting short pipes at the most downstream stage and the connecting short pipe of an upstream stage thereof.

According to this configuration, when a fractional portion remains at the most downstream stage, the pipe length adjusts the pressure loss at each of the branches. Therefore, in the case that the fractional portion remains at the most downstream stage, it is possible to supply to each of the sub tanks at the same amount of the functional liquid.

In this cases, it is preferable that the branch channel has the two-branch joint and the pair of the connecting short pipes of an uppermost stream stage having larger diameters at least than those of the two-branch joint and the pair of the connecting short pipes of the most downstream stage.

According to this configuration, the pressure loss at the branch channel can be made smaller as much as possible.

In this case, it is preferable that the two-branch joint has a T-shaped joint.

According to this configuration, the branch channel is inexpensive with the inexpensive T joint.

According to another aspect of the invention, there is provided a liquid droplet ejection apparatus comprising: a plotting device which plots with functional liquid droplets ejected from an ink jet type functional liquid droplet ejection head while moving the functional liquid droplet ejection head over a workpiece, and the functional liquid supply apparatus described above which supplies the functional liquid to the functional liquid droplet ejection head.

According to this configuration, it is possible to change the main tanks without stopping an operation of the liquid droplet ejection apparatus, leading to a high productivity for the apparatus. In a case that the plotting is done with the functional liquids of three colors, R, G and B, it is preferable that three pairs of functional liquid supply apparatus corresponding to each of the colors.

In this case, it is preferable that a chamber device which manages an internal atmosphere at a predetermined temperature is further provided, wherein the chamber device accommodates the plotting device and the functional liquid supply apparatus except the tank unit which is disposed an outside therefrom.

According to this configuration, it is possible to change the main tanks without opening the chamber device, leading to a high productivity for the apparatus.

According to another aspect of the invention, there is provided a method of manufacturing an electro-optical device which forms a film on the workpiece with the functional liquid droplet by using the liquid droplet ejection apparatus described above.

According to another aspect of the invention, there is provided an electro-optical device which forms a film on the workpiece with the functional liquid droplet by using the liquid droplet ejection device described above.

According to this configuration, it is possible to manufacture electro-optical apparatuses with high quality. Note that examples of the functional materials are: a light emitting material (a luminescent layer, a positive-hole injection layer) of an organic EL (Electro-Luminescence) apparatus, a filter material (a filter element) of the color filter used in a liquid crystal display apparatus, a fluorescent material (a fluorescent element) of an electron ejection apparatus (a Field Emission Display: FED), a fluorescent material (a fluorescent element of a PDP (a Plasma Display Panel) apparatus, and an electrophoresis element material (an electrophoresis element) of an electrophoresis display apparatus, etc. They are liquid materials capable of being ejected from a functional liquid droplet ejection head (an ink jet head). Also, there are the organic EL apparatus, the liquid crystal display apparatus, the electron ejection apparatus, the PDP apparatus, and the electrophoresis display apparatus, etc., as the electro-optical apparatus (the Flat Panel Display: FPD).

According to the other aspect of the invention, there is provided an electronic device having the electro-optical device manufactured by the method of manufacturing the electro-optical device described above, or an electronic device having the electro-optical device described above.

In this case, the electronic apparatus is directed to a cellular phone, a personal computer, and various electronic apparatuses on which a so-called flat panel display is mounted.

BRIEF DESCRIPTION OF THE DRAWINGS

The invention will be described with reference to the accompanying drawings, wherein like numbers reference like elements.

FIG. 10 is a block diagram illustrating a main control system of the liquid droplet ejection apparatus.

FIG. 17 is a flowchart illustrating manufacturing steps of the organic EL display apparatus.

FIG. 19 is a process chart illustrating formation of an organic bank layer.

FIG. 20 is a process chart illustrating processes of forming a positive-hole injection/transport layer.

FIG. 21 is a process chart illustrating a state where the positive-hole injection/transport layer has been formed.

FIG. 24 is a process chart illustrating a state where light-emitting layers having three color components have been formed.

FIG. 25 is a process chart illustrating processes for forming a cathode.

FIG. 26 is a perspective view illustrating an essential part of a plasma display apparatus (PDP apparatus).

FIG. 27 is a sectional view illustrating an essential part of an electron emission display apparatus (FED apparatus).

DESCRIPTION OF EXEMPLARY EMBODIMENTS

An embodiment of the present invention will be described hereinafter with reference to the accompanying drawings. A liquid droplet ejection apparatus according to this embodiment is used in a production line of a flat panel display device. For example, the liquid droplet ejection apparatus employs functional liquid droplet ejection heads using special ink or functional liquid such as luminescent resin liquid to form light-emitting elements serving as pixels of a color filter of a liquid crystal display device or an organic EL device.

Figure 1:
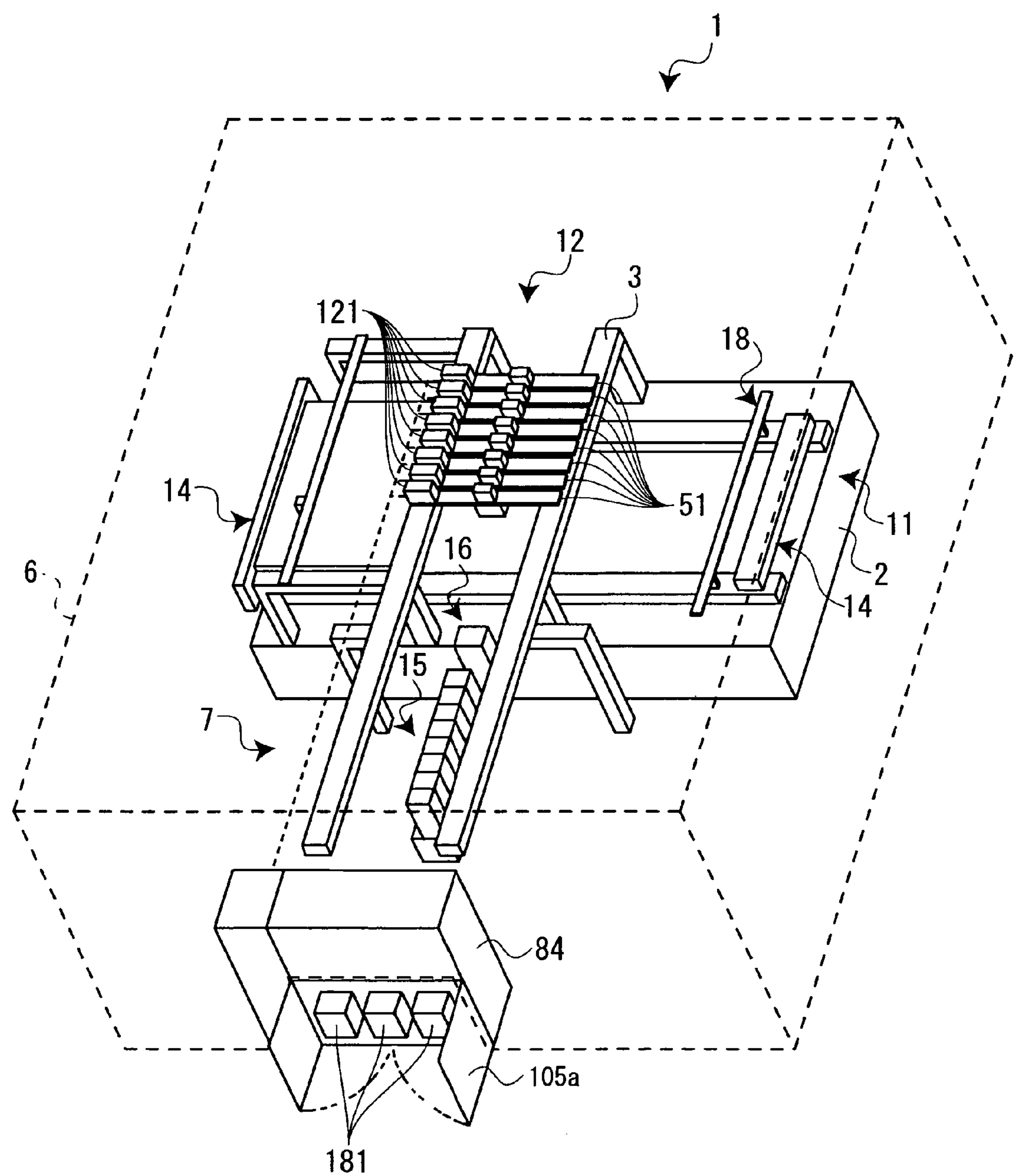
FIG. 1 is a perspective view of a liquid droplet ejection apparatus according to an embodiment.
Figure 2:
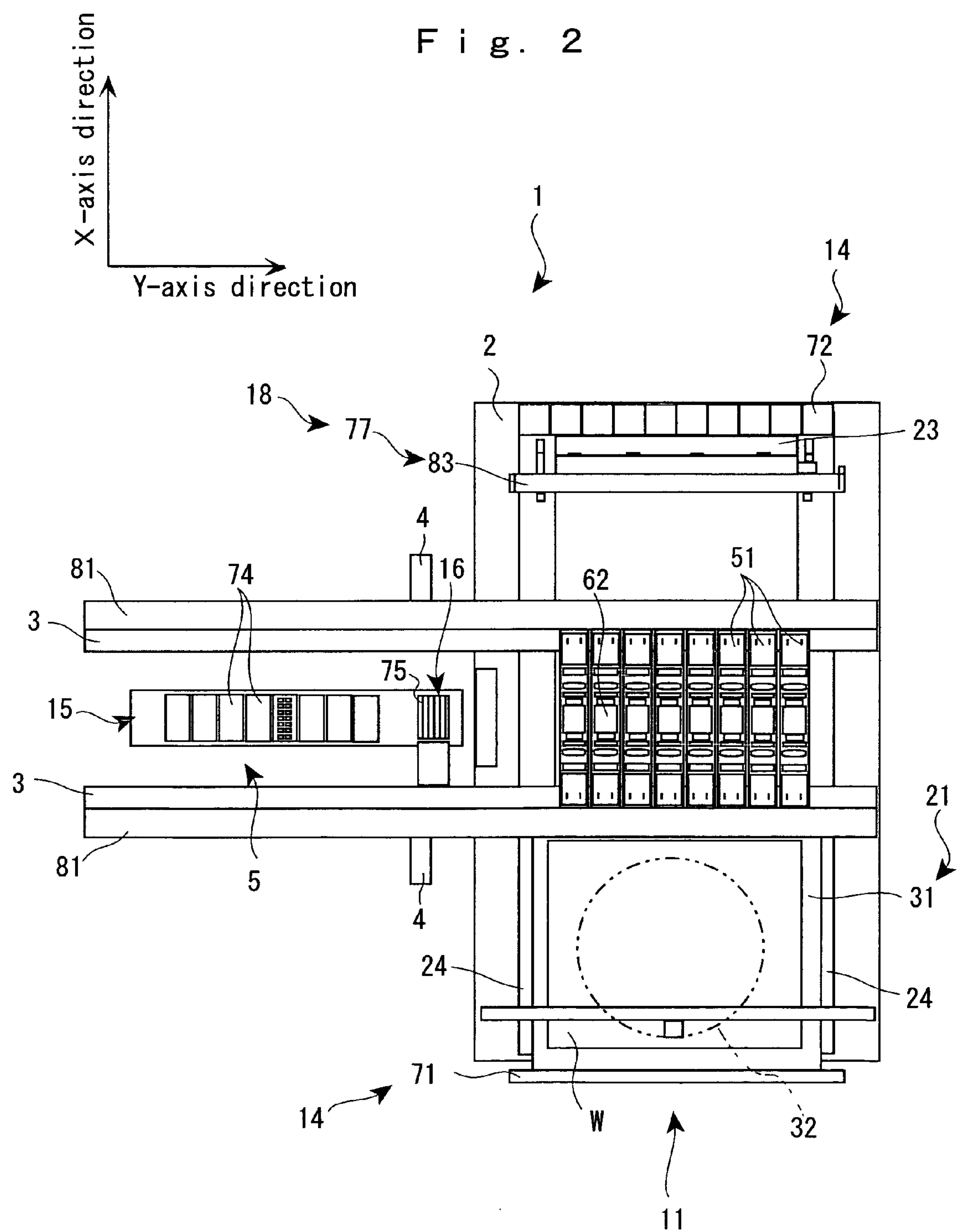
FIG. 2 is a plan view of the liquid droplet ejection apparatus.
Figure 3:
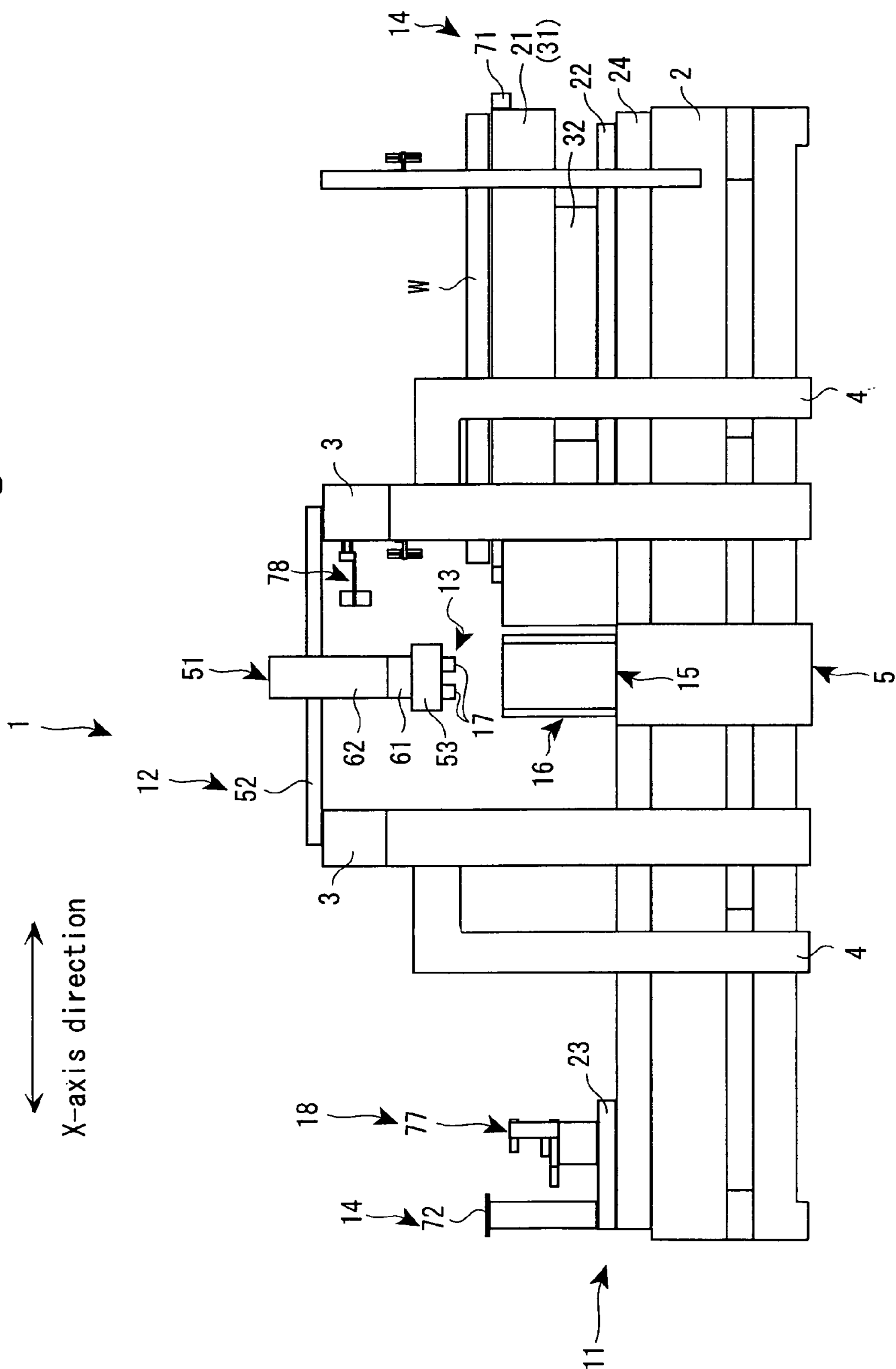
FIG. 3 is a side view of the liquid droplet ejection apparatus.

As shown in FIGS. 1, 2 and 3, a liquid droplet ejection apparatus 1 includes an X-axis table 11, a Y-axis table 12, and eight carriage units 51. The X-axis table 11 is disposed on an X-axis supporting base 2 mounted on a stone surface plate, extends in an X-axis direction which is a main scanning direction, and moves a workpiece W in the X-axis direction (main scanning direction). The Y-axis table 12 is disposed on a pair of (two) Y-axis supporting bases 3 which is arranged so as to stride across the X-axis table 11 with a plurality of poles 4 interposed between the Y-axis supporting bases 3 and the X-axis table 11, and extends in a Y-axis direction which is a sub-scanning direction. Eight carriage units 51 include a plurality of functional liquid droplet ejection heads 17 (not shown) mounted thereon, and are arranged so as to be hung from the Y-axis table 12. Further, the liquid droplet ejection apparatus 1 has a chamber (a chamber device) 6 which accommodates the above components in an atmosphere in which a temperature and a humidity therein is managed, and a functional liquid supply unit 7 which penetrates the chamber 6 and has three pairs of functional liquid supply apparatuses 101 supplying functional liquid from outside the chamber 6 to the functional liquid droplet ejection heads 17 inside the chamber 6. The functional liquid droplet ejection heads 17 are driven to perform ejection processing in synchronization with driving operations of the X-axis table 11 and the Y-axis table 12 whereby functional liquid droplets of three colors, R, G, and B are ejected and a predetermined plotting pattern is plotted on the workpiece W. Note that a plotting device described in claims includes the X-axis table 11, the Y-axis table 12 and eight carriage units 51.

Also, the liquid droplet ejection apparatus 1 includes a maintenance unit 5 having a flushing unit 14, a suction unit 15, a wiping unit 16, and an ejection function inspection unit 18 which are used for maintenance of the functional liquid droplet ejection heads 17 so that functional maintenance and functional recovery of the functional liquid droplet ejection heads 17 are achieved. Note that, among the units constituting the maintenance unit 5, the flushing unit 14 and the ejection function inspection unit 18 are mounted on the X-axis table 11, the suction unit 15 and the wiping unit 16 extend orthogonally to the X-axis table 11 and are disposed on a mount which is placed at a position in which the carriage units 51 can be moved by the Y-axis table 12 (strictly, in the ejection function inspection unit 18, a stage unit 77 (described later) is mounted on the X-axis table 11 and a camera unit 78 is supported on the Y-axis supporting bases 3).

The flushing unit 14 includes a pair of pre-plotting flushing units 71, 71 and a periodic flushing unit 72. The flushing unit 14 receives ejected ink to be lapsed from the functional liquid droplet ejection heads 17 (flushing), which is performed just before the ejection from the functional liquid droplet ejection heads 17 and in a plotting process quiescent period at the time of changing workpieces W. The suction unit 15 includes a plurality of divided suction units 74, forcibly sucks the liquid droplets from ejection nozzles 98 of each of the functional liquid droplet ejection heads 17 and acts as a cap. The wiping unit 16 has a wiping sheet 75 and wipes off a nozzle surface 97 of the functional liquid droplet ejection head 17 after the suction. The ejection performance inspection unit 18 has the stage unit 77 on which the inspection sheet 83 is mounted for receiving functional liquid droplet ejected from the functional liquid droplet ejection heads 17 and the camera unit 78 which inspects the functional liquid droplet on the stage unit 77 by an image recognition. The ejection performance inspection unit 18 inspects an ejection performance of the liquid droplet ejection heads 17 (an existence and a non-existence of ejection and flight deflection).

Components of the liquid droplet ejection apparatus 1 will be described hereinafter. As shown in FIGS. 2 and 3, the X-axis table 11 includes a set table 21, an X-axis first slider 22, an X-axis second slider 23, a pair of right and left X-axis linear motors (not shown), and a pair of (two) X-axis common supporting bases 24. The set table 21 is used to set a workpiece W. The X-axis first slider 22 is used to slidably support the set table 21 in the X direction. The X-axis second slider 23 is used to slidably support the flushing unit 14 and the stage unit 77 in the X-axis direction. The pair of X-axis linear motors extend in the X-axis direction, are used to move the set table 21 (the workpiece W) in the X-axis direction through the X-axis first slider 22, and are used to move the flushing unit 14 and the stage unit 77 in the X-axis direction through the X-axis second slider 23. The pair of X-axis common supporting bases 24 are arranged so as to be parallel to the X-axis linear motors and guide the X-axis first slider 22 and the X-axis second slider 23.

The set table 21 includes a suction table 31 for attracting the workpiece W to be set thereto and a θ table 32 for correcting a position of the workpiece W set on the suction table 31 in a θ-axis direction. Furthermore, a pair of pre-plotting flushing units 71 included in a pre-printing flushing units 111 are additionally provided on a pair of sides of the set table 21 which is parallel to the Y-axis direction.

The Y-axis table 12 includes eight bridge plates 52 on which the eight carriage units 51 are suspended respectively, and eight pairs of Y-axis sliders (not shown) which support the eight bridge plates 52 at both sides thereof. In addition, the Y-axis table 12 includes a pair of Y-axis linear motors (not shown) which are disposed on the pair of Y-axis supporting bases 3 and which are used to move the bridge plates 52 in the Y-axis direction through the eight pairs of Y-axis sliders. Also, the Y-axis table 12 sub-scans the functional liquid droplet ejection heads 17 via each of the carriage units 51 in the plotting process and makes the functional liquid droplet ejection heads 17 face to the maintenance unit 5 (the suction unit 15 and the wiping unit 16).

When the pair of linear motors are (simultaneously) driven, the Y-axis sliders move in parallel to the Y-axis direction with the pair of Y-axis supporting bases 3 as guides. Therefore, the bridge plates 52 move in the Y-axis direction along with the carriage units 51. In this case, each of the carriage units 51 may independently move by drive-controlling the Y-axis linear motors, or the eight carriage units 51 may integrally move by controlling the Y-axis linear motors.

Also, at both ends of the Y-axis table 12, cable holding bodies 81 are disposed in parallel with the Y-axis table 12. Both of the cable holding bodies 81 are fixed on the Y-axis supporting base 3 at one end and are fixed to one of the bridge plates 52 at the other end. The cable holding bodies 81 accommodate cables, air tubes, functional liquid channel (a downstream side functional liquid channel 127 described later) and the like.

Figure 4:
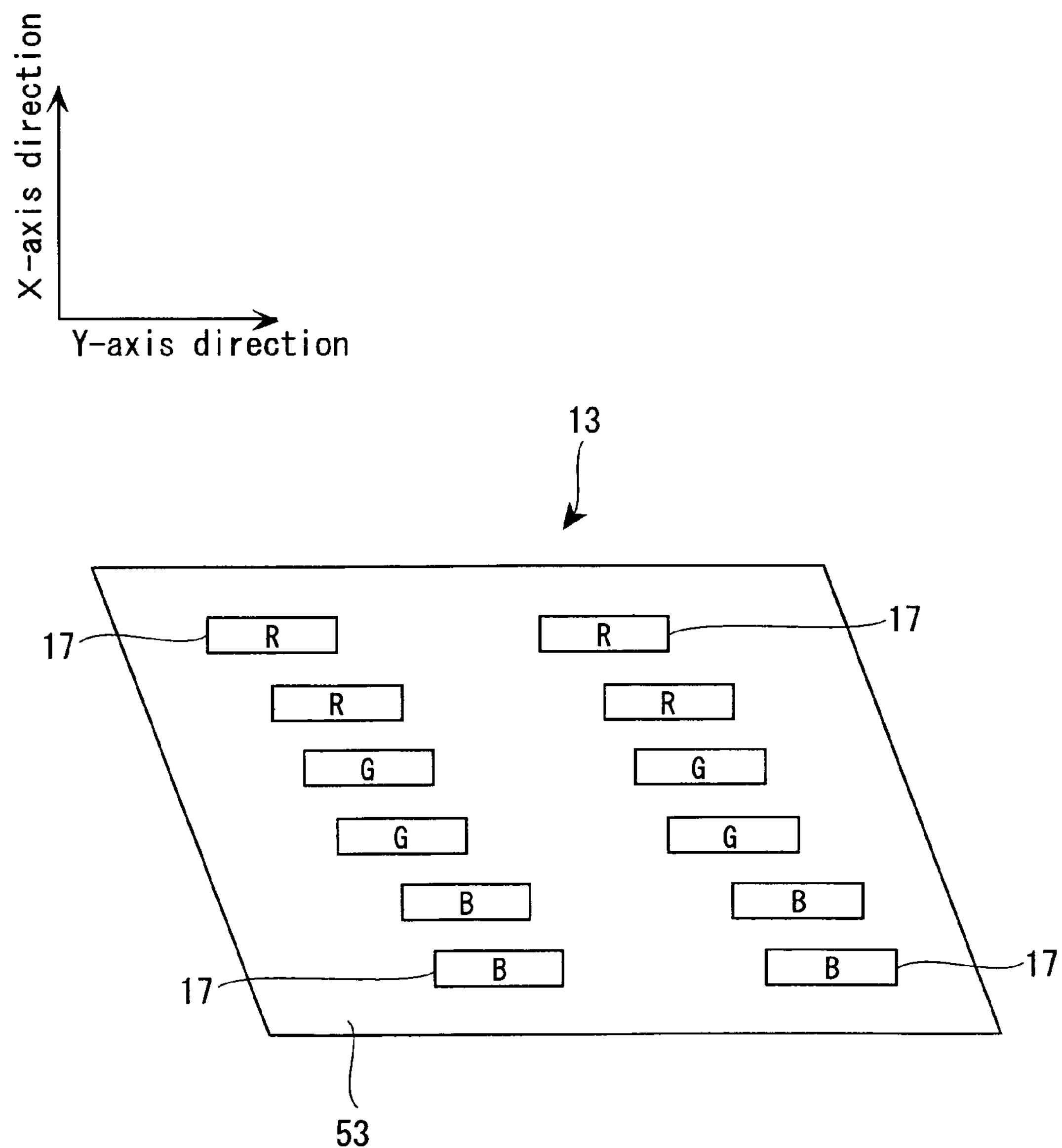
FIG. 4 is a diagram illustrating the functional liquid droplet ejection heads constituting head groups.

Each of the carriage units 51 includes a head unit 13 having twelve functional liquid droplet ejection heads 17 and a carriage plate 53 in which the twelve functional liquid droplet ejection heads 17 are arranged thereon so as to be divided into two groups each of which has six functional liquid droplet ejection heads 17 (refer to FIG. 4). Further, each of the carriage units 51 includes a θ rotation unit 61 which supports the head unit 13 and which performs a θ correction (θ rotation) on the head unit 13, and a hanging member 62 which supports the head unit 13 through the θ-rotation unit 61 so that the Y-axis table 12 (each of the bridge plates 52) supports the head unit 13. In addition, each of the carriage units 51 has a sub tank 121 (described later) on the upper side thereof (actually, disposed on each of the bridge plate 52), and the functional liquid is supplied from the sub tank 121 to each of the functional liquid droplet ejection heads 17.

Figure 5:
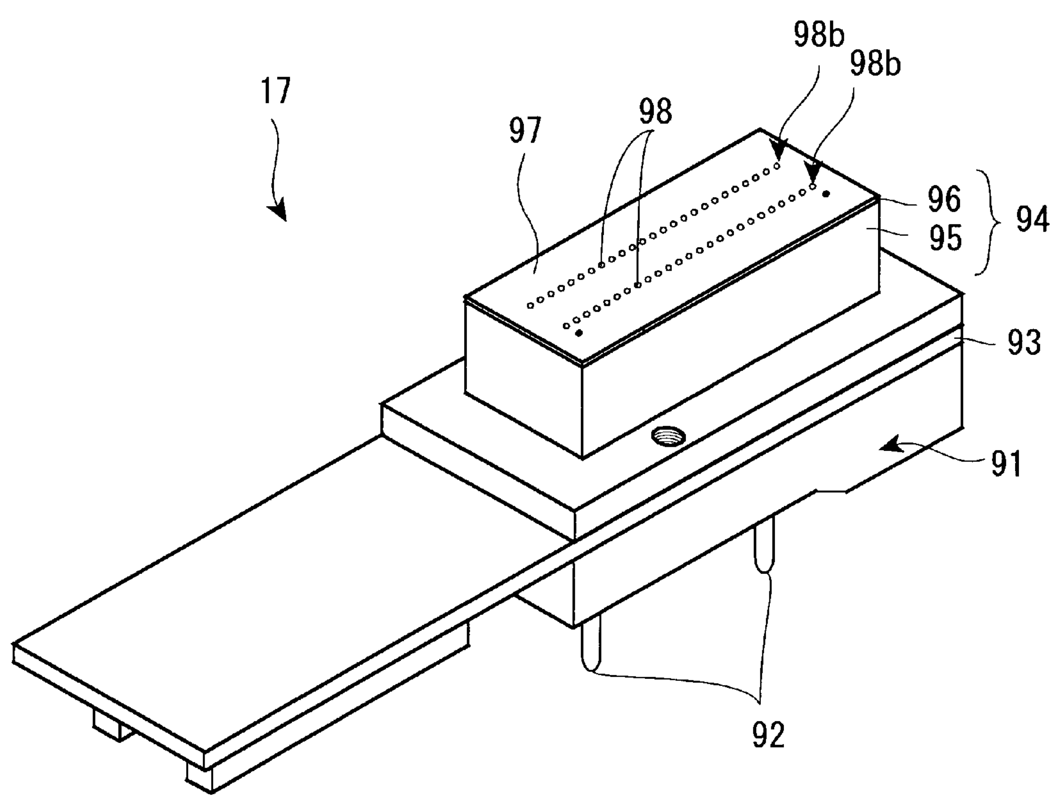
FIG. 5 is a perspective view of a functional liquid droplet ejection head.

As shown in FIG. 5, each of the functional liquid droplet ejection heads 17 is, so-called, a twin-type head, and includes a functional liquid introduction unit 91 having twin connecting needles 92, twin head boards 93 continuing from the functional liquid introduction unit 91, and a head body 94 continuing downwardly of the functional liquid introduction unit 91 and being formed with an in-head flow path filled with the functional liquid therein. The connecting needle 92 is connected to a functional liquid supply unit 7 and supplies the functional liquid to the functional liquid introduction unit 91. The head body 94 includes a cavity 95 (piezoelectric element), and a nozzle plate 96 having a nozzle surface 97 having a number of ejection nozzles 98 opening therethrough. When the functional liquid droplet ejection heads 17 are driven for ejection, (a voltage is applied to the piezoelectric element) and the functional liquid droplets are ejected from the ejection nozzles 98 by a pumping action of the cavities 95.

Two split nozzle rows **98*b* having a number of ejection nozzles 98 are formed on the nozzle surface 97 mutually in parallel with each other. The two split nozzle rows 98*b*** are displaced by a half pitch from each other.

The chamber 6 is constructed to keep an internal temperature and humidity stable. That is, the plotting process on the workpiece W by the liquid droplet ejection apparatus 1 is performed in the atmosphere in which the temperature and the humidity are managed to be constant. A tank cabinet 84 accommodating a tank unit 122 (described later) is provided at a portion of the side wall of the chamber 6. In a case of manufacturing an organic EL apparatus or the like, it is preferable that the chamber 6 has an atmosphere in which inert gas (nitrogen gas) is filled.

Next, referring to FIGS. 1, 6 and 9, the functional liquid supply unit 7 will be explained. The functional liquid supply unit 7 has a three pairs of functional liquid supply apparatuses 101 corresponding to three colors, R, G and B. Further, the functional liquid supply unit 7 has: nitrogen gas supply units 85 which supply a compressed nitrogen gas for controlling main tanks 181 and the sub tanks 121 (described later) and the like; compressed air supply units 86 which supply compressed air for controlling various opening and closing valves; gas exhaustion units 87 which exhaust gas from corresponding tanks; and vacuum units 89 connected to respective bubble elimination units 135. The three pairs of functional liquid supply apparatuses 101 are connected to functional liquid droplet ejection heads 17 corresponding to three colors R, G and B, respectively, whereby a functional liquid of a corresponding color is supplied to the functional liquid droplet ejection heads 17 of each color, R, G and B.

Figure 6:
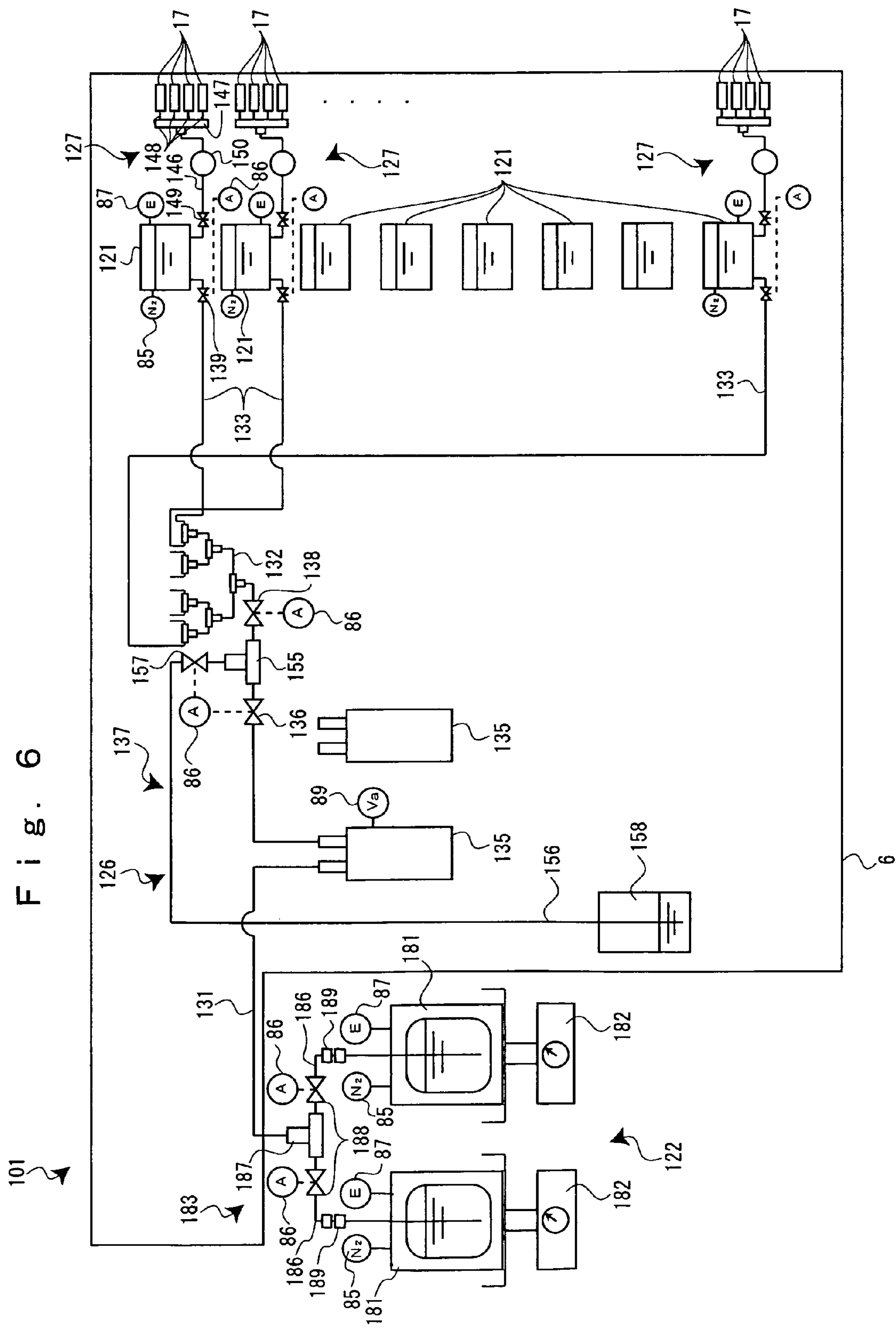
FIG. 6 is a piping system diagram of a functional liquid supply apparatus.

As shown in FIG. 6, each of the functional liquid supply apparatus 101 has: a tank unit 122 having two main tanks 181, 181 constituting supply sources of the functional liquid; eight sub tanks 121 provided to correspond to each of the carriage units 51; an upstream side functional liquid channel (functional liquid channel) 126 connecting the tank unit 122 with eight sub tanks 121; and eight pairs of downstream side functional liquid channels (head side channels) 127 connecting each of the sub tanks 121 with each of the functional liquid droplet ejection heads 17.

The functional liquid in each of the main tanks 181 is pressurized by the compression nitrogen gas from the nitrogen gas supply unit 85 which is connected to a corresponding main tank, and selectively supplied to the eight sub tanks 121 through the upstream side functional liquid channel 126. At this time, various opening and closing valves are controlled to be opened or closed by the compressed air from the compressed air supply unit 86. Simultaneously, each of the sub tanks 121 is released to air through the gas exhaustion unit 87 and receives a necessary amount of the functional liquid. The functional liquid in each of the sub tanks 121 is supplied to the functional liquid droplet ejection head 17 through the downstream side functional channel 127 by driving the functional liquid droplet ejection head 17 connected to the sub tank, while remaining a predetermined head pressure. Though the details will be explained later, the compression nitrogen gas is supplied to each of the sub tanks 121 when the functional liquid from each of the sub tanks 121 is fed reversely, and each of the main tanks 181 is released to air through the gas exhaustion unit 87 (actually, a negative pressure control). Note that the nitrogen gas supply unit 85 in claims includes a liquid pressurizing and feeding device and a sub pressurizing device.

The tank unit 122 has: a pair of main tanks 181, 181 which are supply sources of the functional liquid; a pair of weight measuring apparatuses 182, 182 measuring weights of the pair of main tanks 181, 181; a switching mechanism (a switching device) 183 connected to the pair of main tanks 181, 181 and the upstream side functional liquid channel 126. Each of the main tanks 181 is connected to the nitrogen gas supply unit 85 and the gas exhaustion unit 87 respectively, and is constructed to be capable of pressurization-controlling when the functional liquid is fed pressurizingly and for negative pressurization (corresponding to the air release) when the functional liquid is fed reversely.

The switching mechanism 183 has: a pair of tank channels 186, 186 connected to the pair of main tanks 181, 181; a tank channel joint 187 of which the upstream side is connected to the pair of tank channels 186, 186 and the downstream side is connected to the upstream side functional liquid channel 126; and tank opening and closing valves 188 provided on each of the tank channels 186, 186. By opening one tank opening and closing valve 188 and closing the other opening and closing valve 188, a connection with the upstream side functional liquid channel 126 is switched to one of the pair of main tanks 181, 181, alternatively.

The weight measuring apparatuses 182 are, for example, constituted by load cells or the like. When the functional liquid in the main tank 181 is consumed and reduced to a predetermined weight, a warning is issued for informing time to change the main tanks. Also, a bubble detection sensor 189 (constituted by two optical sensors) is provided on each of the tank channels 186. After the weight of one of the main tanks 181 reduces to the predetermined weight, then the bubble detection sensor 189 detects bubbles, the channel is switched to the other main tank 181 (automatically or manually). Note that the warning may be issued by a liquid level detection sensor, the bubble detection sensor or the like, in place of the weight measuring apparatus 182.

Thus, when one of the main tanks 181 is detected that it needs to be changed by the weight measuring apparatus 182 and the bubble detection sensor 189, the other main tank 181 is switched to the upstream side functional liquid channel 126 by the switching mechanism 183, thereby it is possible to replenish to the sub tanks 121 by the other main tank 181. Namely, even when one of the main tanks 181 is changed, the other main tank 181 can continue to replenish to the sub tanks 121. Therefore, when the main tank 181 is changed, it is not necessary to stop the plotting process, leading to a high productivity.

The upstream side functional liquid channel 126 has: a main channel 131 of which upstream side is connected to the tank unit 122; an eight-branch channel (a branch channel) 132 of which upstream side is connected to the main channel 131; and eight branching channels 133 each of which downstream side is connected to the corresponding sub tank 121, from the upstream side. The functional liquid supplied from the tank unit 122 is divided into eight by the eight-branch channel 132 and is supplied to each of the sub tanks 121.

Also, on the main channel 131, a bubble elimination unit (a bubble elimination device) 135, a first opening and closing valve 136, an air-drawn unit 137, and a second opening and closing valve 138 are provided respectively, from the upstream side. Further, each of the eight-branch channels 132 is connected to a third opening and closing valve (a branching channel opening and closing device) 139 which is adjacent to each of the sub tanks 121.

Each of the downstream side functional liquid channels 127 includes: a head side main channel 146 of which upstream side is connected to each of the sub tanks 121; a four branch channel 147 of which upstream side is connected to the head side main channel 146; and a plurality of an individual channels 148 of which upstream sides are connected to the four branch channel 147. With this configuration, the functional liquid is divided into four from each of the sub tanks 121 and is supplied to each of the functional liquid droplet ejection heads 17. In other words, the functional liquid is supplied to the functional liquid droplet ejection heads 17 having 8×4 heads with the eight branches of the upstream side functional liquid channel 126 and the four branches of the downstream side functional liquid channel 127. Additionally, as the functional liquid supply unit 7 has the three pairs of functional liquid supply apparatuses 101 for R, G and B, the functional liquid is supplied to the functional liquid droplet ejection heads 17 having 8×12 heads. Moreover, on the head side main channel 146, fourth opening and closing valve (a head channel opening and closing device) 149 and a decompression valve 150 are provided.

The bubble elimination unit 135 is connected to the above vacuum unit 89, which vacuums an internal channel separated by a gas permeation film. This causes bubbles in the functional liquid in the internal channel to permeate through the gas permeation film and to be eliminated. With having this kind of the bubble elimination unit 135, it is possible to avoid occurrence of big bubbles with micro bubbles in the functional liquid. Therefore, the functional liquid containing bubbles can not be reached to the sub tanks 121, whereby, in the sub tanks 121, a false detection for a liquid level by a liquid level detection sensor 177 (described later) can not be occurred. Therefore, it is possible to detect the liquid level of the functional liquid precisely, and the head pressure of the functional liquid droplet ejection heads 17 can be held stably, leading to restraining the functional liquid droplet ejection heads 17 from false ejections. It is preferable that an auxiliary bubble elimination unit 135 is prepared so as to be changed quickly, because the bubble elimination unit 135 is an article of consumption (refer to FIG. 6).

The air-drawn unit 137 has: an air-drawn joint (an air-drawn device) 155 on the main channel 131; an air-drawn valve (an air-drawn device) 157 having an opening and closing valve and the bubble detection sensor; an air-drawn channel 156 in conjunction to the air-drawn valve 157; and a liquid storing tank 158 provided at the downstream side of the air-drawn channel 156. The air-drawn unit 137 functions when the functional liquid is filled initially in the functional liquid supply apparatus 101. When the functional liquid is fed from the main tank 181, the air-drawn valve 157 is opened and the second opening and closing valve 138 is closed, causing the air in the main channel 131 to be ejected. Then, when the air-drawn valve 157 detects the bubbles (after a while), the air-drawn valve 157 is closed and the second opening and closing valve 138 is opened, and the air drawing is completed. Note that the air-drawn device in claims includes the air-drawn joint 155 and the air-drawn valve 157.

With this kind of the air-drawn unit 137, it is possible to draw out unnecessary air adequately when in the initial filling. Therefore, it is possible to eliminate the unnecessary air easily when in the initial filling. In a case where the functional liquid flown down to the liquid storing tank 158 is recycled, three liquid storing tanks 158 corresponding to each color are provided, whereas in a case where the functional liquid is not recycled, a single liquid storing tank 158 is provided.

The third opening and closing valve 139 and the fourth opening and closing valve 149 provided in the vicinities of the upstream and the downstream sides of each of the sub tanks 121 are constructed with air-operated valves which are capable of opening and closing without changing volumes thereof, whereby pulsations of the functional liquid occurring when the opening and closing valves are opened or closed are avoided. Therefore, the pulsations are not transmitted to the functional liquid droplet ejection heads 17 and false ejections from the functional liquid droplet ejection heads 17 are restrained. It is preferable that these opening and closing valves are formed with diaphragm air-operated valves. With this, as an opening and a closing of the opening and closing valves can be performed slowly, the valves are so constructed that these can be opened and closed easily without changing the volumes thereof. Also, by using air-operated valves, temperature increase of the functional liquid passing through the opening and closing valves can be avoided, in addition to an explosion protection function.

Figure 8A:
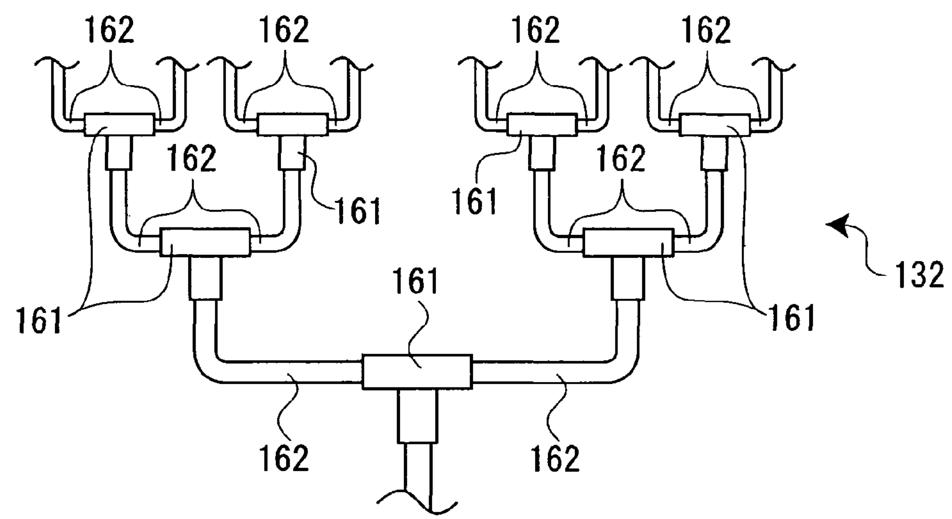
FIGS. 8A and 8B are views showing an eight-branch channel and a ten-branch channel as a modification thereof.

The eight-branch channel 132 is constructed such that a two-branch joint 161 formed by a T-shaped joint and a pair of connecting short pipes connected to the downstream side of the two-branch joint 161 in each stage, the stage repeated three times from the upstream side end to the downstream side end (refer to FIG. 8A). The eight-branch channel 132 is disposed such that the upstream side thereof is at the bottom and the downstream side thereof is at the top, so as to cause the functional liquid supplied from the tank unit 122 to flow from the bottom to the top. By using such the eight-branch channel 132, as pressure losses at the downstream ends of the eight-branch channel 132 are equivalent, liquid flow speed (flow amount) of eight branching channels 133 can be stable. By setting the eight-branch channel 132 upside-down, the functional liquid flows from the bottom to the top, and the air can not be remained in the eight-branch channel 132. Also, by using inexpensive T-shaped joints as two-branch joints, eight-branch channel 132 can be inexpensive.

In the eight-branch channel 132, the two-branch joint 161 and the pair of connecting short pipes 162, 162 on the uppermost stream stage are formed larger in diameter than the two-branch joints 161 and the pairs of connecting short pipes 162, 162 in the most downstream stage. This leads to pressure losses as smaller as possible in the eight-branch channel 132.

Figure 8B:
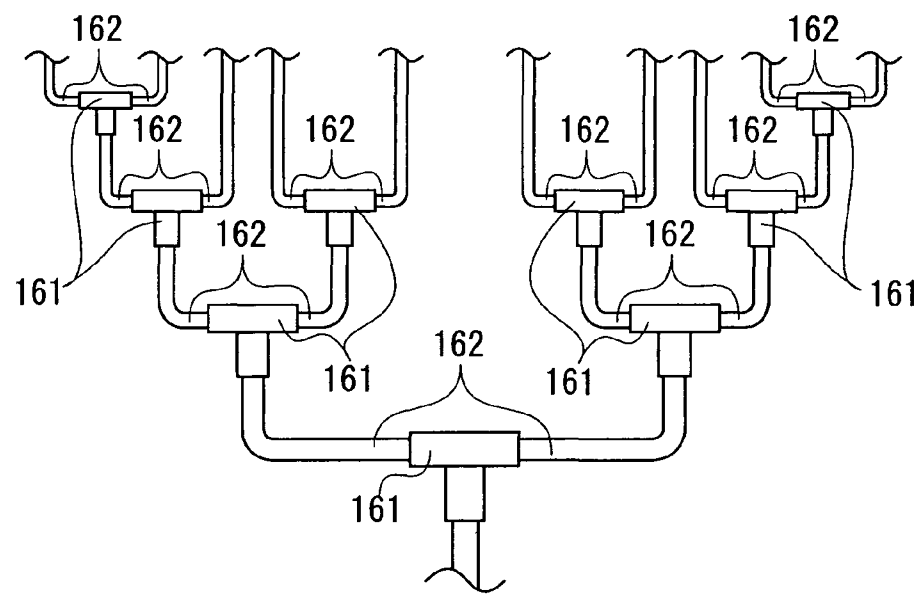

As the eight-branch channel is used in the embodiment, a fractional portion does not remain. When the fractional portion remains, for example, ten branches (a ten branch channel) are used, six branches are configured with three two-branch joints 161 and three connecting short pipes 162, whereas the remaining four branches are configured with four two-branch joints 161 and four connecting short pipes 162 (refer to FIG. 8B). In this case, when channel lengths of the six branches and the other four branches differ, the flow amount of the functional liquid to the sub tanks 121 are not equivalent. Therefore, pressure losses are regulated by pipe length between the pairs of connecting short pipes 162, 162 (the other four branches) at the most downstream stage and the connecting short pipes 162 (six branches) at the upstream stage thereof.

Also, it is preferable that the four branch channel 147 of each of the downstream side functional liquid channels 127 may be constructed as same as the above eight-branch channel 132. However, in this case, it is preferable that the upstream side of the four branch channel 147 is set at the top and the downstream side thereof is set at the bottom. With this configuration, even when bubbles are mixed in the downstream side functional liquid channel 127, the bubbles are drawn to the sub tanks 121 side.

The decompression valve 150 is to be active at an atmospheric pressure criteria and is to retain a head pressure between the corresponding functional liquid droplet ejection head 17 within a predetermined allowable range. By using the decompression valve 150, it is possible to precisely manage the head pressure of the functional liquid at the nozzle surface 97 of the functional liquid droplet ejection head 17.

Figure 9:
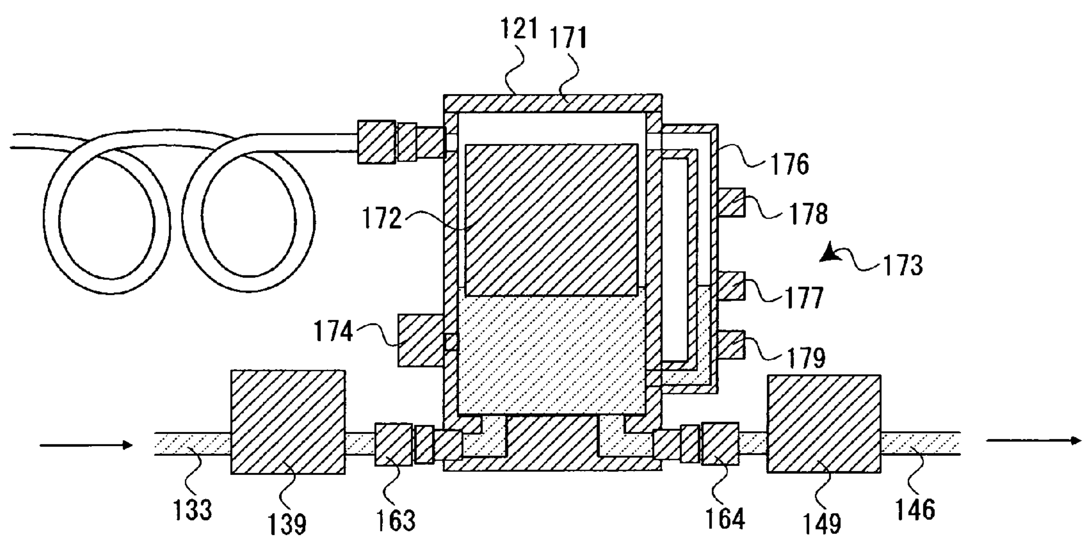
FIG. 9 is a schematic cross sectional view of a sub tank and the vicinity thereof.

As shown in FIG. 9, the sub tank 121 has: a sub tank body 171 which stores the functional liquid; a lid body float 172 which floats in the sub tank body 171 in a form of a drop lid; a transparent bypass tube 176 provided on a side of the sub tank body 171; a liquid level detection mechanism 173 which faces to the bypass tube 176 and detects the liquid level of the stored functional liquid; and a liquid pressure sensor 174 provided on the lower side of the sub tank body 171. The sub tank 121 further has the nitrogen gas supply unit 85 and the gas exhaustion unit 87 connected to the upper portion of the sub tank body 171 (refer to FIG. 6), and the inner side of the sub tank body 171 can be released to air when the functional liquid is fed from the main tank 181 and can be controlled with pressure to the main tank 181. Additionally, at the lower of the sub tank body 171, an inflow joint 163 connected to the branching channel 133 and an outflow joint 164 connected to the head side main channel 146. The functional liquid flows in and out from the lower of the sub tank body 171.

The liquid level detection mechanism 173 has: an upper limit detection sensor (an upper limit detection device) 178 which faces to the bypass tube 176 and detects the liquid level of the functional liquid as an upper limit; a liquid level detection sensor 177 provided at the center position in an upper and a lower directions and detects the liquid level of the functional liquid at replenishing; and a lower limit detection sensor 179 which detects the liquid level of the functional liquid as a lower limit. The upper limit detection sensor 178 is provided so as to avoid an overflow of the sub tank 121. When the upper limit detection sensor 178 detects the upper limit liquid level, a liquid feeding from the main tank 181 is stopped. On the other hand, the lower limit detection sensor 179 is provided so as to avoid the sub tank 121 being empty. When the lower limit detection sensor 179 detects the lower limit liquid level, the liquid droplet ejection apparatus 1 is stopped at the completion of current plotting process on the workpiece W.

Also, when the upper limit detection sensor 178 detects the upper limit liquid level, then, the functional liquid of the sub tank 121 is reversely fed to the main tank 181. The reverse feeding is performed with the fourth opening and closing valve 149 closed and the third opening and closing valve 139 opened, with a pressurization to the main tank 181 released (negative controlled), thereby the sub tank 121 is pressurized (pressure-controlled) and the functional liquid flows reversely. When the liquid level detection sensor 177 detects the liquid level, the reverse feeding is completed. With such the reverse feeding action, the functional liquid overly supplied to the sub tank 121 is not abandoned and is processed properly.

The liquid level detection sensor 177 is to detect the liquid level in consideration of an ideal head pressure of the functional liquid droplet ejection head 17. The liquid level of the functional liquid is detected by the liquid level detection sensor 177, the liquid level is detected as a full liquid or a reduced liquid with cooperating with a controller 197 (described later). In other words, when the liquid level is above the liquid level detection sensor 177, the liquid is decreased by the ejection process, and the liquid level detection sensor 177 detects the liquid level, the liquid level is determined as the reduced liquid level. On the other hand, when the liquid level is below the liquid level detection sensor 177, the liquid is increased by a replenishing operation, and the liquid level detection sensor 177 detects the liquid level, the liquid level is determined as the full liquid level after a predetermined period of time has passed. With this liquid level detection sensor 177, the liquid level of the functional liquid in the sub tank 121 is controlled at the center position in the upper and the lower directions. Thus, as the liquid level of the functional liquid is controlled at the center position in the upper and the lower directions in the sub tank 121, a plenty of space (gas volume) where the functional liquid is not filled in can be provided at all times. This causes the pulsations of the functional liquid occurred at the upstream side of the sub tank 121 to be absorbed and false ejections of the functional liquid droplet ejection head 17 can be avoided.

Figure 7A:
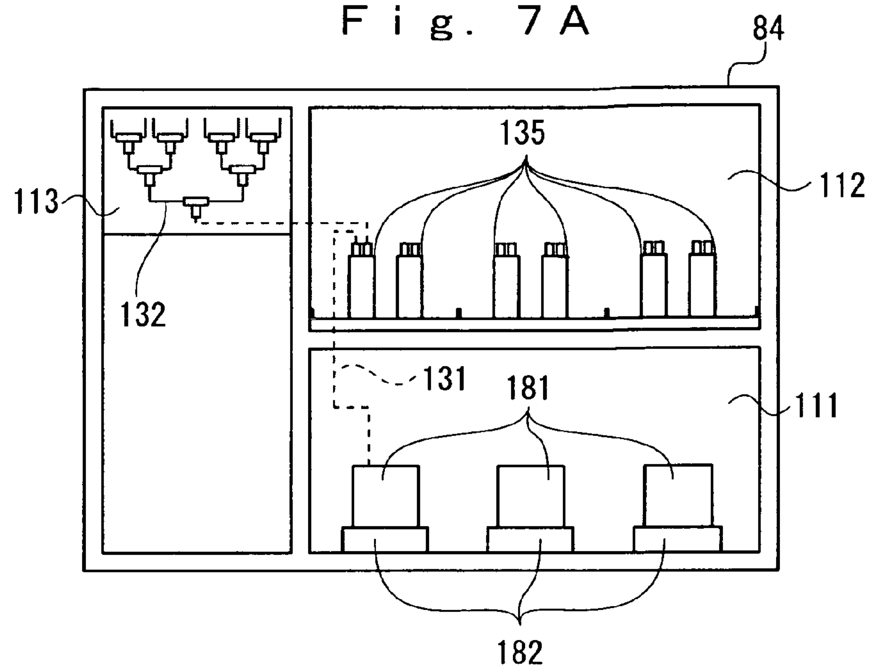
FIGS. 7A and 7B are views of a tank cabinet.
Figure 7B:
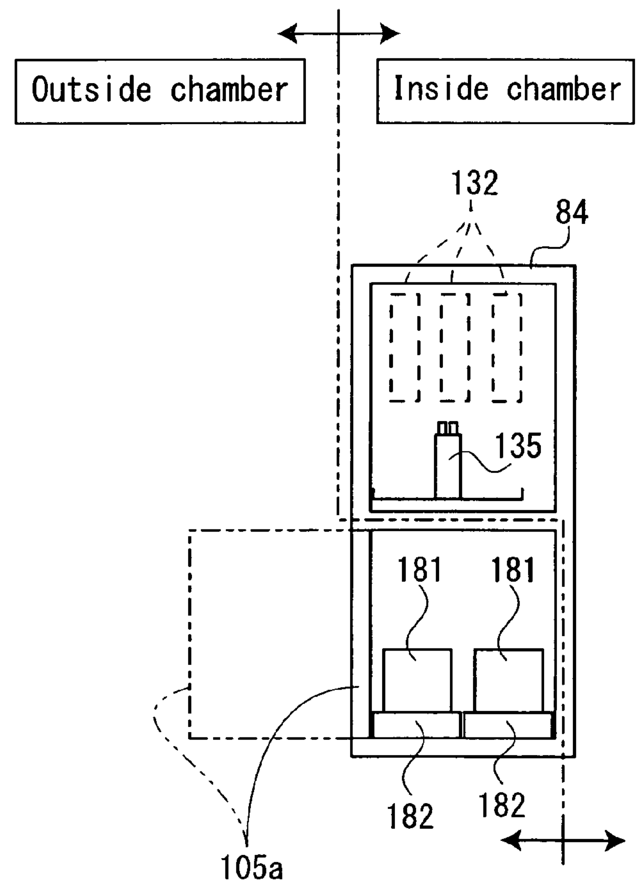

As shown in FIG. 7, each of the components from the tank unit 122 to the eight-branch channel 132 of each of the functional liquid supply apparatuses 101 is accommodated in the tank cabinet 84 provided on the side wall of the chamber 6 (refer to FIG. 1). As shown in FIG. 7, the tank cabinet 84 has: a main tank housing 111 which houses each of the tank units 122; a unit housing 112 which is provided at the upper of the main tank housing 111 and houses each of the bubble elimination units 135; and a branch channel housing 113 which is provided adjacent to the unit housing 112 and houses each of the eight-branch channels 132.

The main tank housing 111 has a opening/closing door 105*a* which opens and closed to the outside of the chamber 6. Opening/closing doors (not shown) of the unit housing 112 and the branch channel housing 113 open and close to the inside of the chamber 6, respectively. Namely, each of the bubble elimination units 135 and each of eight-branch channels 132 are provided inside the chamber 6, and each of the tank units 122 is provided outside the chamber 6. Therefore, the tank unit 122 is constructed in which the main tanks 181 can be changed without changing air of the chamber 6. Thus, by disposing the tank unit 122 outside the chamber 6, it is not necessary to open the chamber 6 when changing the main tanks 181. With this configuration, the atmosphere in the chamber 6 is not disturbed every time the main tanks 181 are changed. In other words, it is possible to change the main tanks 181 without a necessity of regulating the temperature and humidity again (in a case where the inert gas atmosphere is set in the chamber 6, the inert gas is not leaked to outside), leading to an improvement of productivity of the apparatus.

Referring to FIG. 10, a main control system of the liquid droplet ejection apparatus 1 will be described. As shown in FIG. 10, the liquid droplet ejection apparatus 1 includes a liquid droplet ejection section 191, a workpiece moving section 192, a head moving section 193, a maintenance section 194, a function liquid supply section 198, a detector 195, a driving section 196, and a controller 197 (the liquid feeding control device and the liquid level control device). The liquid droplet ejection section 191 includes the head unit 13 (the functional liquid droplet ejection heads 17). The workpiece moving section 192 includes the X-axis table 11 and is used to move the workpiece W in the X-axis direction. The head moving section 193 includes the Y-axis table 12 and is used to move the head unit 13 in the Y-axis direction. The maintenance section 194 includes units used for maintenance. The functional liquid supply section 198 includes the functional liquid supply unit 7 and supplies the functional liquid to the functional liquid droplet ejection heads 17. The detector 195 includes various sensors used for various detection operations. The driving section 196 includes various drivers which control and drive these individual sections. The controller 197 is connected to the individual sections and entirely controls the liquid droplet ejection apparatus 1.

The controller 197 includes various components such as an interface 201, a RAM 202, a ROM 203, a hard disk 204, a CPU 205, and a bus 206. The interface 201 is used to connect the various units to each other. The RAM 202 has a storage area capable of storing data temporarily and is used as a workspace for control processing. The ROM 203 has various storage areas and is used to store control programs and control data. The hard disk 204 stores plotted data used when a predetermined plotting pattern is plotted onto the workpiece W and a variety of data transmitted from the various units, and further stores programs used for processing the variety of data. The CPU 205 performs calculation processing for the variety of data in accordance with the programs stored in the ROM 203 and the hard disk 204. The bus 206 is used to connect the components to each other.

The controller 197 is used to input the variety of data transmitted from the various units through the interface 201 and allows the CPU 205 to perform the calculation processing in accordance with the programs stored in the hard disk 204 (or in accordance with the programs read from the ROM 203 using a CD-ROM drive, for example). A result of the calculation processing is output to the units through the driving section 196 (the various drivers). Thus, the liquid droplet ejection apparatus 1 is entirely controlled and various processes of the liquid droplet ejection apparatus 1 are performed.

A functional liquid supply operation to the functional liquid droplet ejection heads 17 will be explained. In this operation, the functional liquid is stored in each of the main tanks 181 and each of the sub tanks 121, and the operation is performed in a state that the functional liquid is filled in each of the channels. Additionally, one of the main tanks 181 which is connected to the upstream side functional liquid channel 126 is pressurized by the nitrogen gas supply unit 85.

With a state in which the third opening and closing valve 139 provided on the upstream side of the sub tank 121 is closed, the functional liquid droplet ejection heads 17 are driven to eject the functional liquid droplets. As the third opening and closing valve 139 is closed, the pressure from the main tank 181 is freed and the functional liquid is fed from each of the sub tanks 121 to each of the functional liquid droplet ejection heads 17 with a pumping action of the functional liquid droplet ejection heads 17. Note that the head pressure at the nozzle surface 97 of the functional liquid droplet ejection head 17 is in a final adjustment by the decompression valve 150 provided on the downstream side functional liquid channel 127.

A replenishment of the functional liquid to the sub tanks 121 will be explained. When a certain amount of the functional liquid in the sub tanks 121 decreases by the ejecting process of the functional liquid droplet ejection heads 17, a decreased liquid state is detected by the liquid level detection mechanism 173. In a case where the decreased liquid state is detected, the functional liquid is replenished from the main tank 181 to the sub tanks 121 through the opening of the third opening and closing valve 139. As the main tank 181 is pressurized, the functional liquid in the main tank 181 is fed to the sub tanks 121 automatically by opening the third opening and closing valve 139. Note that, in this case, the ejecting process of the functional liquid droplet ejection heads 17 continues.

When the functional liquid is fed from the main tank 181 to the sub tanks 121, and is stored in the sub tanks 121 with a certain amount, the full liquid state in the sub tanks 121 is detected by the liquid level detection mechanism 173. As the full liquid state is detected, the third opening and closing valve 139 is closed to complete the replenishment operation. Note that the above reverse feeding process of the functional liquid is performed by the above control system.

A handling operation at the time of no functional liquid in the main tank 181 connected to the upstream side functional liquid channel 126 will be explained. As the replenishment operation to the sub tanks 121 is repeated, the functional liquid in the main tank 181 decreases, and it is detected by the corresponding weight measuring apparatus 182 that the main tank 181 needs to be changed. When it is determined that the main tank 181 needs to be changed, the connection with the upstream side functional liquid channel 126 is switched from the main tank 181 which needs to be changed to the other main tank 181 (in the full liquid state) by the switching mechanism 183. The other main tank 181 performs the replenishment operation to the sub tanks 121. At this moment, the main tank 181 which needs to be changed can be changed without stopping the supply operation to the sub tanks 121 (ejecting drive of the functional liquid droplet ejection heads 17). Thus, a replacement for the main tank 181 can be performed.

According to the structure above, when the functional liquid of one of the main tanks 181 is empty, by switching tanks with the switching mechanism 183, one of the main tank 181 can be replaced while the other main tank 181 can supply the functional liquid. Thus, changing the main tanks 181 can be performed without stopping the replenishment of the functional liquid to each of the sub tanks 121. Therefore, it is not necessary to stop the plotting process by the functional liquid droplet ejection heads 17 and the productivity can be increased.

In this embodiment, the liquid droplet ejection apparatus 1 having eight carriage units 51 is used, but the number of the carriage units 51 is discretionary.

Taking electro-optical apparatuses (flat panel display apparatuses) manufactured using the liquid droplet ejection apparatus 1 and active matrix substrates formed on the electro-optical apparatuses as display apparatuses as examples, configurations and manufacturing methods thereof will now be described. Examples of the electro-optical apparatuses include a color filter, a liquid crystal display apparatus, an organic EL apparatus, a plasma display apparatus (PDP (plasma display panel) apparatus), and an electron emission apparatus (FED (field emission display) apparatus and SED (surface-conduction electron emitter display) apparatus). Note that the active matrix substrate includes thin-film transistors, source lines and data lines which are electrically connected to the thin film transistors.

Figure 11:
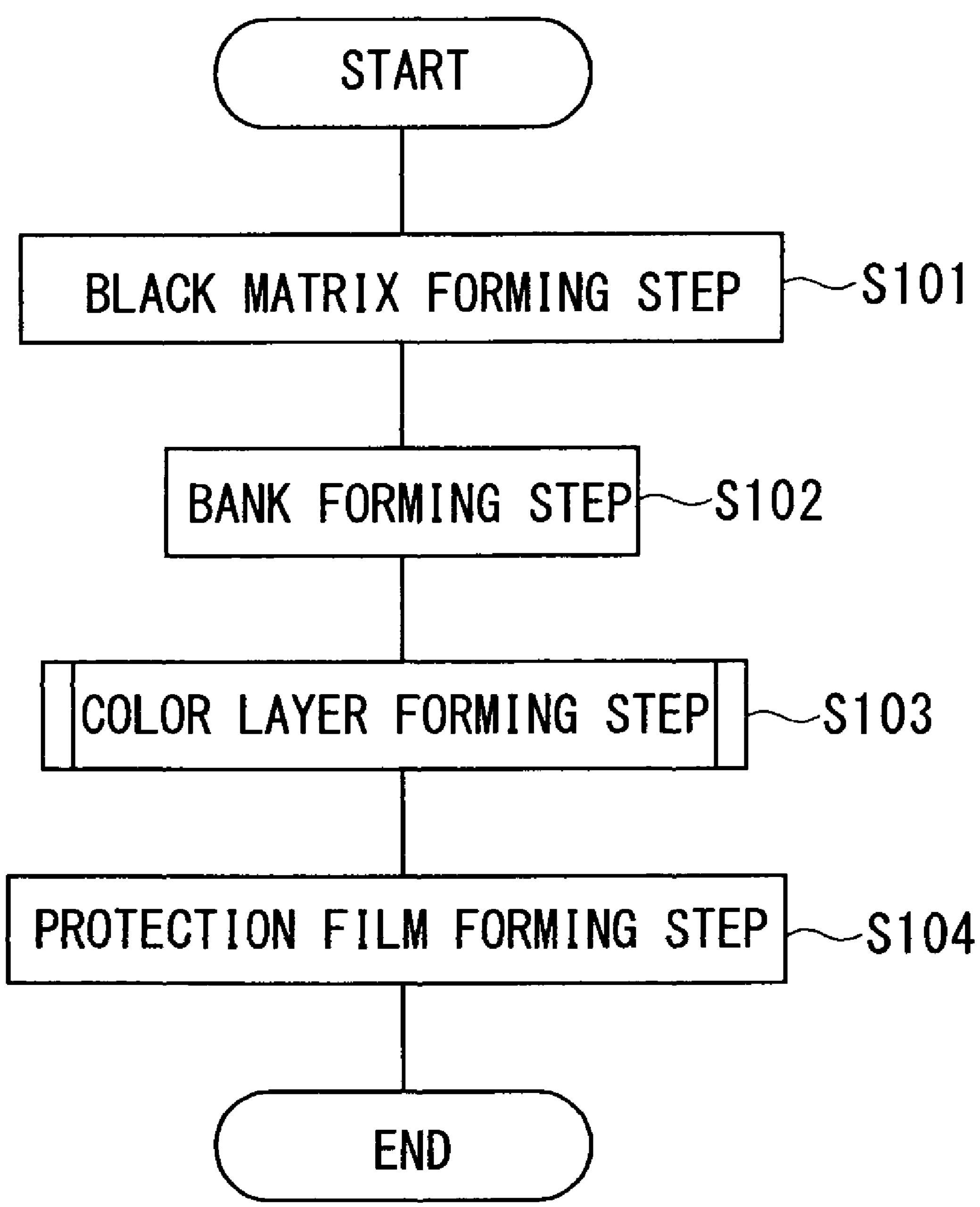
FIG. 11 is a flow chart illustrating manufacturing steps of the color filter.

First, a manufacturing method of a color filter incorporated in a liquid crystal display apparatus or an organic EL apparatus will be described. FIG. 11 shows a flowchart illustrating manufacturing steps of a color filter. FIGS. 12A to 12E are sectional views of the color filter 500 (a filter substrate 500A) of this embodiment shown in an order of the manufacturing steps.

Figure 12A:
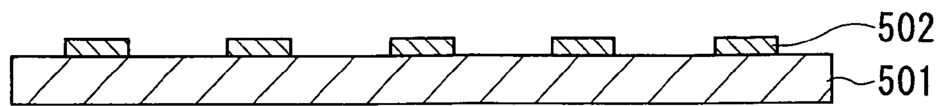
FIGS. 12A to 12E are sectional views schematically illustrating the color filter showing in an order of manufacturing steps.

In a black matrix forming step (step S101), as shown in FIG. 12A, a black matrix 502 is formed on the substrate (W) 501. The black matrix 502 is formed of a chromium metal, a laminated body of a chromium metal and a chromium oxide, or a resin black, for example. The black matrix 502 may be formed of a thin metal film by a sputtering method or a vapor deposition method. Alternatively, the black matrix 502 may be formed of a thin resin film by a gravure printing method, a photoresist method, or a thermal transfer method.

Figure 12B:
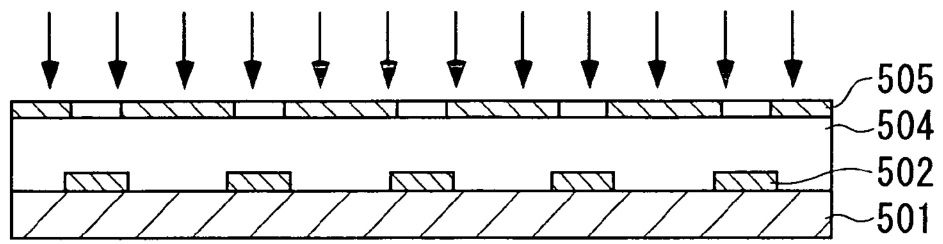

In a bank forming step (step S102), the bank 503 is formed so as to be superposed on the black matrix 502. Specifically, as shown in FIG. 12B, a resist layer 504 which is formed of a transparent negative photosensitive resin is formed so as to cover the substrate 501 and the black matrix 502. An upper surface of the resist layer 504 is covered with a mask film 505 formed in a matrix pattern. In this state, exposure processing is performed.

Figure 12C:
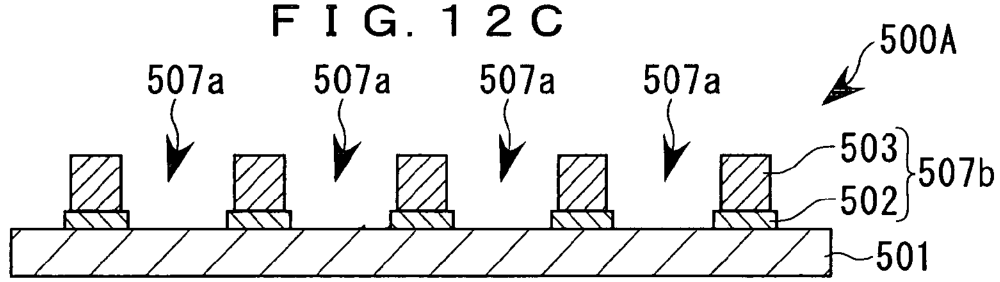

Furthermore, as shown in FIG. 12C, the resist layer 504 is patterned by performing etching processing on portions of the resist layer 504 which are not exposed, and the bank 503 is thus formed. Note that when the black matrix 502 is formed of a resin black, the black matrix 502 also serves as a bank.

The bank 503 and the black matrix 502 disposed beneath the bank 503 serve as a partition wall 507*b* for partitioning the pixel areas 507*a*. The partition wall 507*b* defines receiving areas for receiving the functional liquid ejected when the functional liquid droplet ejection heads 17 form coloring layers (film portions) 508R, 508G, and 508B in a subsequent coloring layer forming step.

The filter substrate 500A is obtained through the black matrix forming step and the bank forming step.

Note that, in this embodiment, a resin material having a lyophobic (hydrophobic) film surface is used as a material of the bank 503. Since a surface of the substrate (glass substrate) 501 is lyophilic (hydrophilic), variation of positions to which the liquid droplet is projected in the each of the pixel areas 507*a* surrounded by the bank 503 (partition wall 507*b*) can be automatically corrected in the subsequent coloring layer forming step.

Figure 12D:
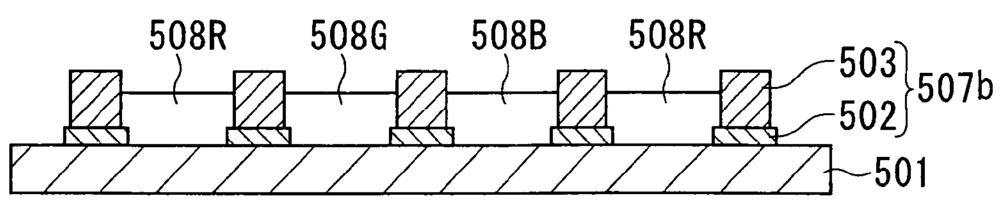

In the coloring layer forming step (S103), as shown in FIG. 12D, the functional liquid droplet ejection heads 17 eject the functional liquid within the pixel areas 507*a* each of which are surrounded by the partition wall 507*b*. In this case, the functional liquid droplet ejection heads 17 eject functional liquid droplets using functional liquids (filter materials) of colors R, G, and B. A color scheme pattern of the three colors R, G, and B may be the stripe arrangement, the mosaic arrangement, or the delta arrangement.

Figure 12E:
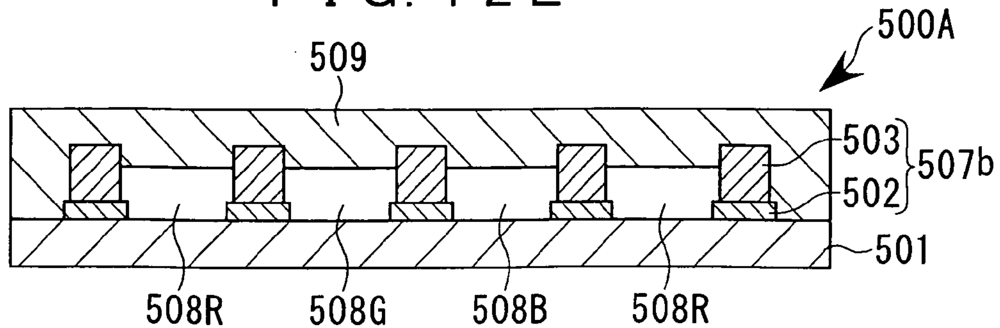

Then drying processing (such as heat treatment) is performed so that the three color functional liquids are fixed, and thus three coloring layers 508R, 508G, and 508B are formed. Thereafter, a protective film forming step is reached (step S104). As shown in FIG. 12E, a protective film 509 is formed so as to cover surfaces of the substrate 501, the partition wall 507*b*, and the three coloring layers 508R, 508G, and 508B.

That is, after liquid used for the protective film is ejected onto the entire surface of the substrate 501 on which the coloring layers 508R, 508G, and 508B are formed and the drying process is performed, the protective film 509 is formed.

In the manufacturing method of the color filter 500, after the protective film 509 is formed, a coating step is performed in which ITO (Indium Tin Oxide) serving as a transparent electrode in the subsequent step is coated.

Figure 13:
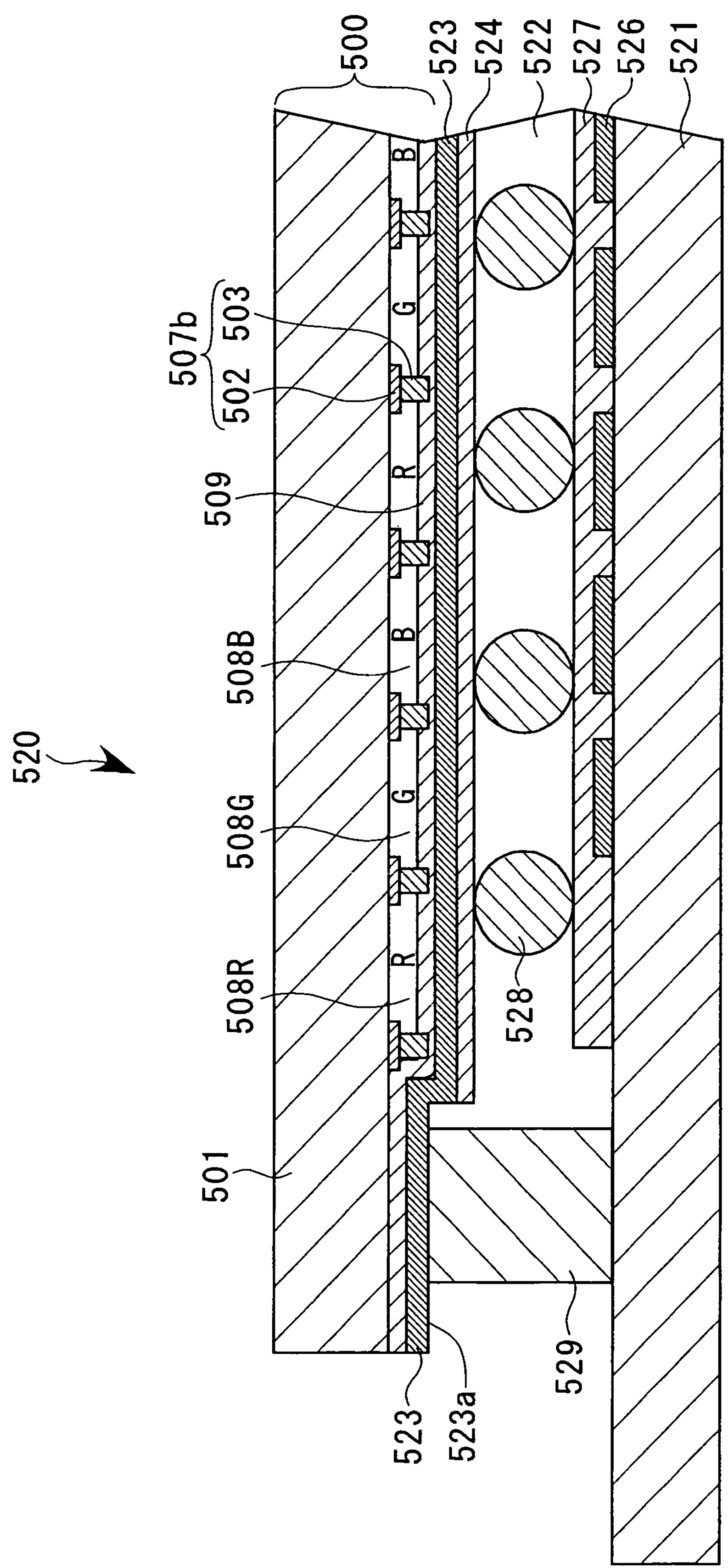
FIG. 13 is a sectional view schematically illustrating an essential part of a first liquid crystal display apparatus employing the color filter according to an embodiment of the invention.

FIG. 13 is a sectional view of an essential part of a passive matrix liquid crystal display apparatus (liquid crystal display apparatus 520) and schematically illustrates a configuration thereof as an example of a liquid crystal display apparatus employing the color filter 500. A transmissive liquid crystal display apparatus as a final product can be obtained by disposing a liquid crystal driving IC (integrated circuit), a backlight, and additional components such as supporting members on the display apparatus 520. Note that the color filter 500 is the same as that shown in FIGS. 12A to 12E, and therefore, reference numerals the same as those used in FIGS. 12A to 12E to denote the same components, and descriptions thereof are omitted.

The display apparatus 520 includes the color filter 500, a counter substrate 521 such as a glass substrate, and a liquid crystal layer 522 formed of STN (super twisted nematic) liquid crystal compositions sandwiched therebetween. The color filter 500 is disposed on the upper side of FIG. 13 (on an observer side).

Although not shown, polarizing plates are disposed so as to face an outer surface of the counter substrate 521 and an outer surface of the color filter 500 (surfaces which are remote from the liquid crystal layer 522). A backlight is disposed so as to face an outer surface of the polarizing plate disposed near the counter substrate 521.

A plurality of rectangular first electrodes 523 extending in a horizontal direction in FIG. 13 are formed with predetermined intervals therebetween on a surface of the protective film 509 (near the liquid crystal layer 522) of the color filter 500. A first alignment layer 524 is arranged so as to cover surfaces of the first electrodes 523 which are surfaces remote from the color filter 500.

On the other hand, a plurality of rectangular second electrodes 526 extending in a direction perpendicular to the first electrodes 523 disposed on the color filter 500 are formed with predetermined intervals therebetween on a surface of the counter substrate 521 which faces the color filter 500. A second alignment layer 527 is arranged so as to cover surfaces of the second electrodes 526 near the liquid crystal layer 522. The first electrodes 523 and the second electrodes 526 are formed of a transparent conductive material such as an ITO.

A plurality of spacers 528 disposed in the liquid crystal layer 522 are used to maintain the thickness (cell gap) of the liquid crystal layer 522 constant. A seal member 529 is used to prevent the liquid crystal compositions in the liquid crystal layer 522 from leaking to the outside. Note that an end of each of the first electrodes 523 extends beyond the seal member 529 and serves as wiring 523*a*.

Pixels are arranged at intersections of the first electrodes 523 and the second electrodes 526. The coloring layers 508R, 508G, and 508B are arranged on the color filter 500 so as to correspond to the pixels.

In normal manufacturing processing, the first electrodes 523 are patterned and the first alignment layer 524 is applied on the color filter 500 whereby a first half portion of the display apparatus 520 on the color filter 500 side is manufactured. Similarly, the second electrodes 526 are patterned and the second alignment layer 527 is applied on the counter substrate 521 whereby a second half portion of the display apparatus 520 on the counter substrate 521 side is manufactured. Thereafter, the spacers 528 and the seal member 529 are formed on the second half portion, and the first half portion is attached to the second half portion. Then, liquid crystal to be included in the liquid crystal layer 522 is injected from an inlet of the seal member 529, and the inlet is sealed. Finally, the polarizing plates and the backlight are disposed.

The liquid droplet ejection apparatus 1 of this embodiment may apply a spacer material (functional liquid) constituting the cell gap, for example, and uniformly apply liquid crystal (functional liquid) to an area sealed by the seal member 529 before the first half portion is attached to the second half portion. Furthermore, the seal member 529 may be printed using the functional liquid droplet ejection heads 17. Moreover, the first alignment layer 524 and the second alignment layer 527 may be applied using the functional liquid droplet ejection heads 17.

Figure 14:
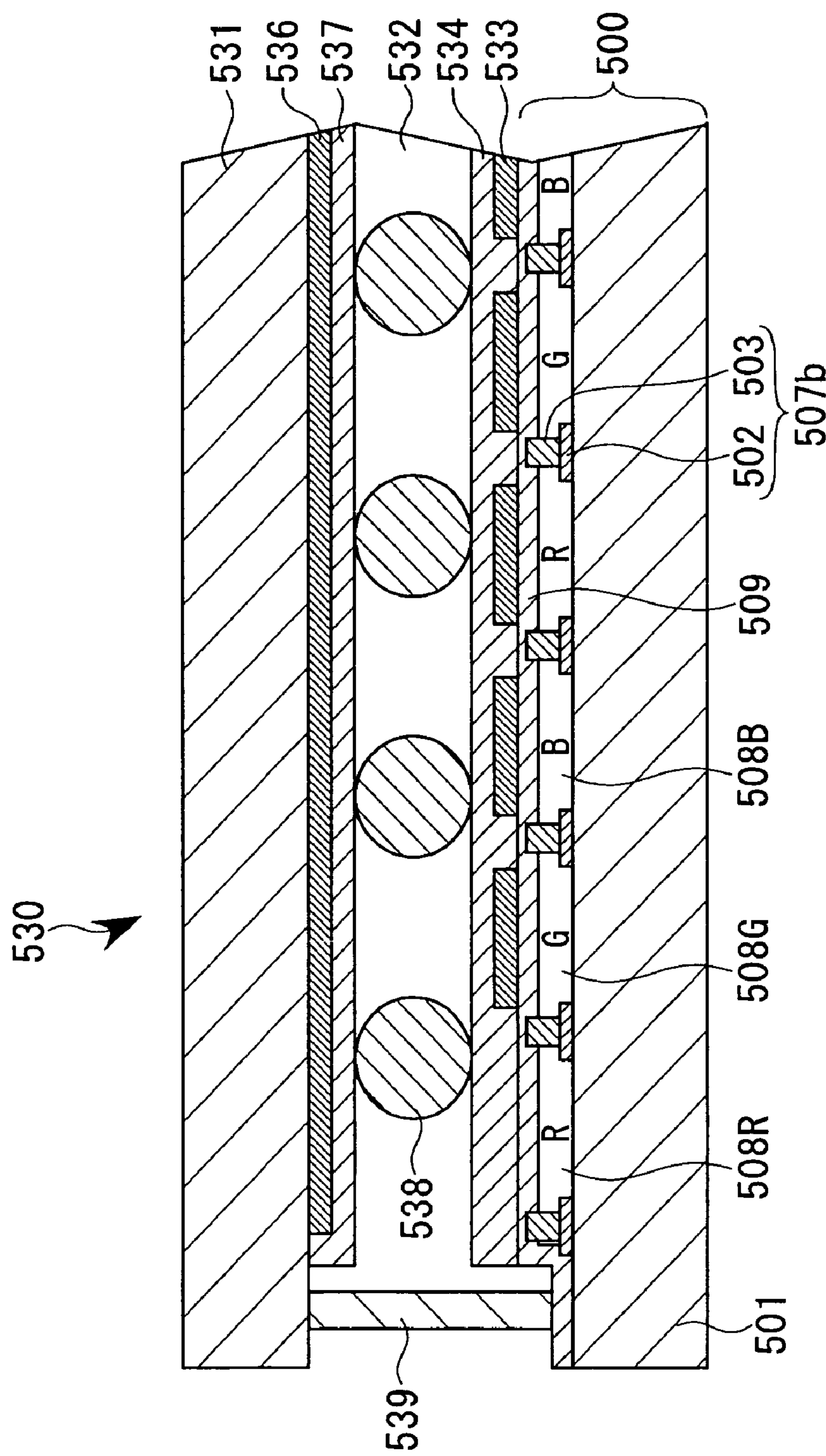
FIG. 14 is a sectional view schematically illustrating an essential part of a second liquid crystal display apparatus employing the color filter according to an embodiment of the invention.

FIG. 14 is a sectional view of an essential part of a display apparatus 530 and schematically illustrates a configuration thereof as a second example of a liquid crystal display apparatus employing the color filter 500 which is manufactured in this embodiment.

The display apparatus 530 is considerably different from the display apparatus 520 in that the color filter 500 is disposed on a lower side in FIG. 14 (remote from the observer).

The display apparatus 530 is substantially configured such that a liquid crystal layer 532 constituted by STN liquid crystal is arranged between the color filter 500 and a counter substrate 531 such as a glass substrate. Although not shown, polarizing plates are disposed so as to face an outer surface of the counter substrate 531 and an outer surface of the color filter 500.

A plurality of rectangular first electrodes 533 extending in a depth direction of FIG. 14 are formed with predetermined intervals therebetween on a surface of the protective film 509 (near the liquid crystal layer 532) of the color filter 500. A first alignment layer 534 is arranged so as to cover surfaces of the first electrodes 533 which are surfaces near the liquid crystal layer 532.

On the other hand, a plurality of rectangular second electrodes 536 extending in a direction perpendicular to the first electrodes 533 disposed on the color filter 500 are formed with predetermined intervals therebetween on a surface of the counter substrate 531 which faces the color filter 500. A second alignment layer 537 is arranged so as to cover surfaces of the second electrodes 536 near the liquid crystal layer 532.

A plurality of spacers 538 disposed in the liquid crystal layer 532 are used to maintain the thickness (cell gap) of the liquid crystal layer 532 constant. A seal member 539 is used to prevent the liquid crystal compositions in the liquid crystal layer 532 from leaking to the outside.

As with the display apparatus 520, pixels are arranged at intersections of the first electrodes 533 and the second electrodes 536. The coloring layers 508R, 508G, and 508B are arranged on the color filter 500 so as to correspond to the pixels.

Figure 15:
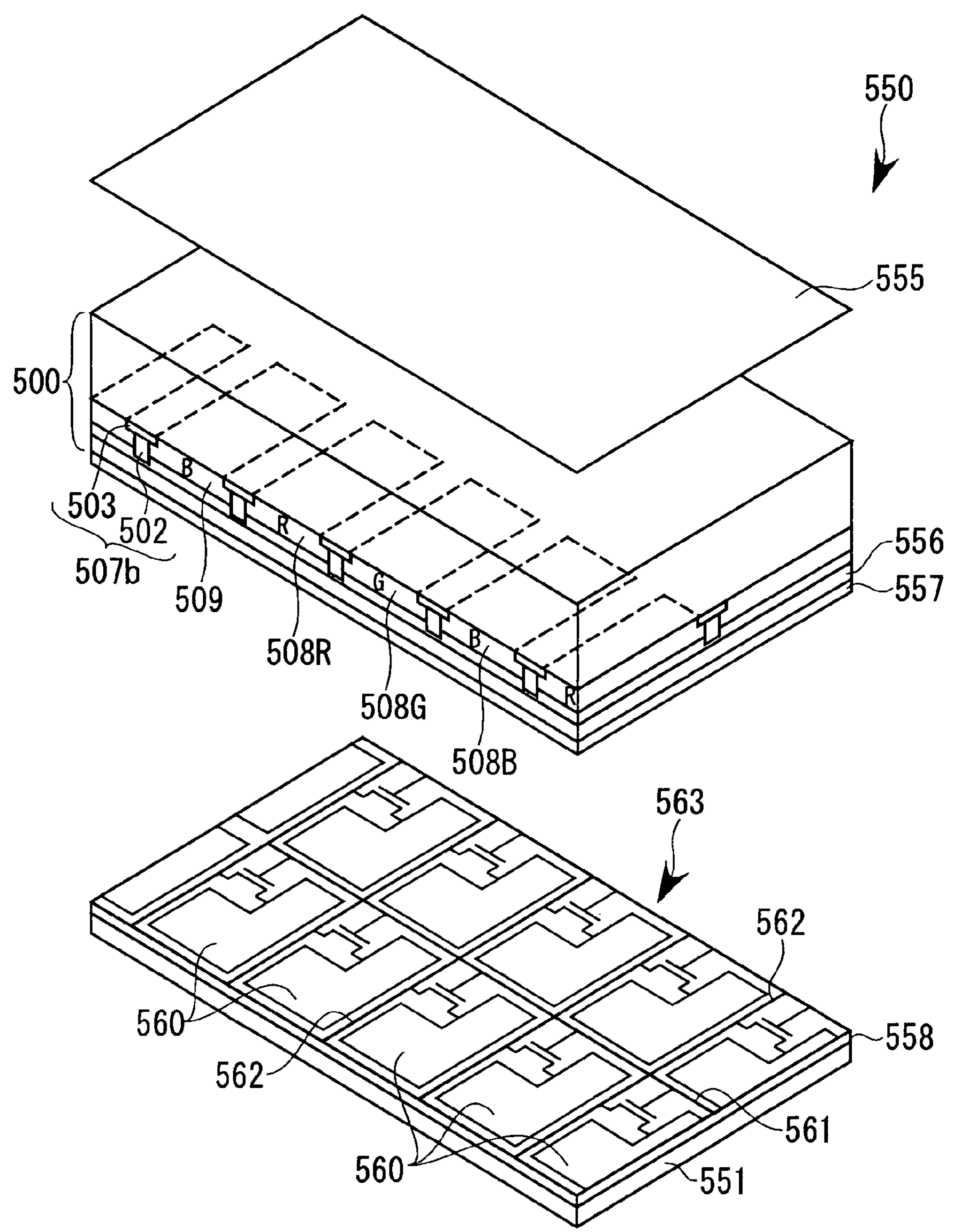
FIG. 15 is a sectional view schematically illustrating an essential part of a third liquid crystal display apparatus employing the color filter according to an embodiment of the invention.

FIG. 15 is an exploded perspective view of a transmissive TFT (thin film transistor) liquid crystal display device and schematically illustrates a configuration thereof as a third example of a liquid crystal display apparatus employing the color filter 500 to which the present invention is applied.

A liquid crystal display apparatus 550 has the color filter 500 disposed on the upper side of FIG. 15 (on the observer side).

The liquid crystal display apparatus 550 includes the color filter 500, a counter substrate 551 disposed so as to face the color filter 500, a liquid crystal layer (not shown) interposed therebetween, a polarizing plate 555 disposed so as to face an upper surface of the color filter 500 (on the observer side), and a polarizing plate (not shown) disposed so as to face a lower surface of the counter substrate 551.

An electrode 556 used for driving the liquid crystal is formed on a surface of the protective film 509 (a surface near the counter substrate 551) of the color filter 500. The electrode 556 is formed of a transparent conductive material such as an ITO and entirely covers an area in which pixel electrodes 560 are to be formed which will be described later. An alignment layer 557 is arranged so as to cover a surface of the electrode 556 remote from the pixel electrode 560.

An insulating film 558 is formed on a surface of the counter substrate 551 which faces the color filter 500. On the insulating film 558, scanning lines 561 and signal lines 562 are arranged so as to intersect with each other. Pixel electrodes 560 are formed in areas surrounded by the scanning lines 561 and the signal lines 562. Note that an alignment layer (not shown) is arranged on the pixel electrodes 560 in an actual liquid crystal display apparatus.

Thin-film transistors 563 each of which includes a source electrode, a drain electrode, a semiconductor layer, and a gate electrode are incorporated in areas surrounded by notch portions of the pixel electrodes 560, the scanning lines 561, and the signal lines 562. When signals are supplied to the scanning lines 561 and the signal lines 562, the thin-film transistors 563 are turned on or off so that power supply to the pixel electrodes 560 is controlled.

Note that although each of the display apparatuses 520, 530, and 550 is configured as a transmissive liquid crystal display apparatus, each of the display apparatuses 520, 530, and 550 may be configured as a reflective liquid crystal display apparatus having a reflective layer or a semi-transmissive liquid crystal display apparatus having a semi-transmissive reflective layer.

Figure 16:
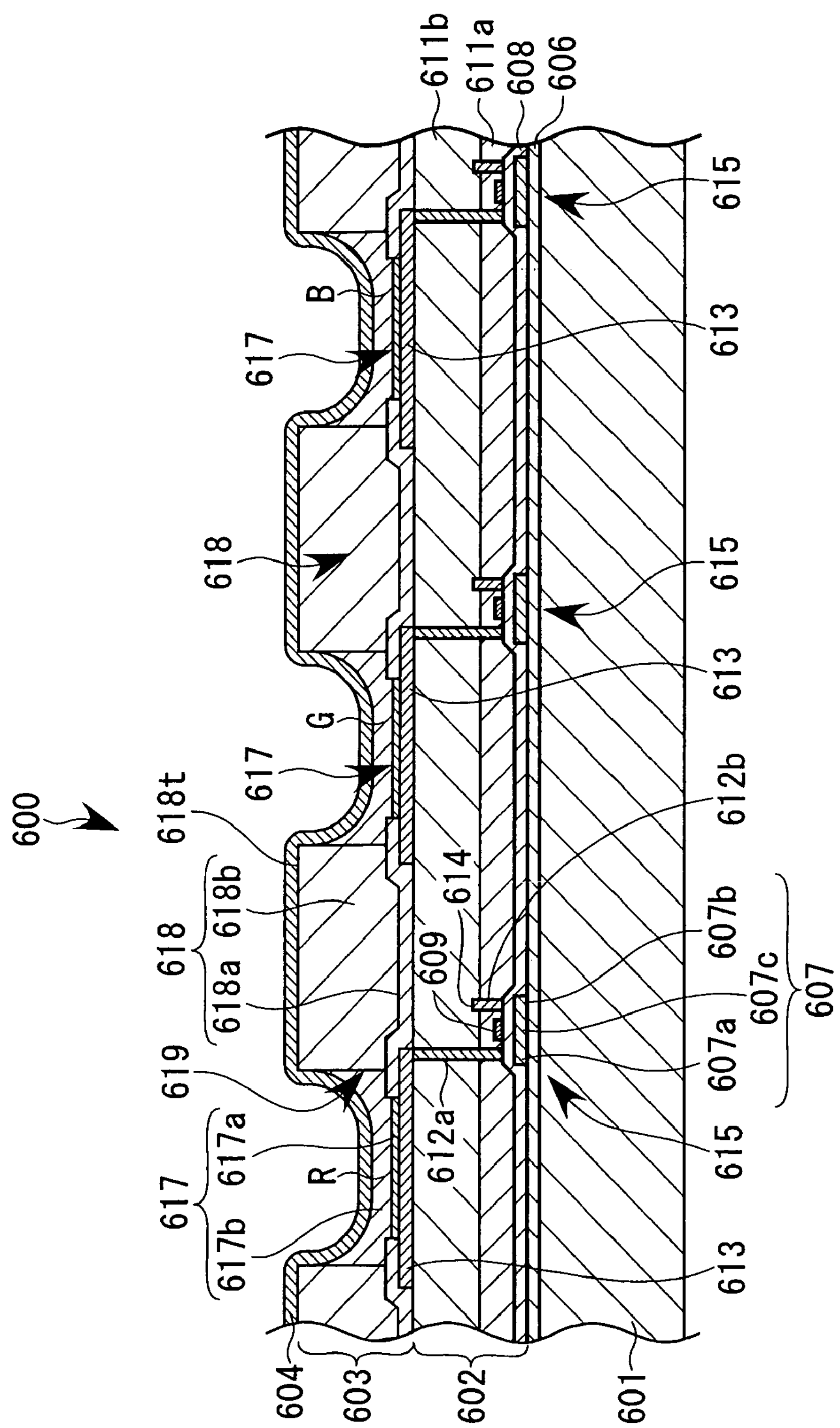
FIG. 16 is a sectional view illustrating an essential part of an organic EL display apparatus.

FIG. 16 is a sectional view illustrating an essential part of a display area of an organic EL apparatus (hereinafter simply referred to as a display apparatus 600).

In this display apparatus 600, a circuit element portion 602, a light-emitting element portion 603, and a cathode 604 are laminated on a substrate (W) 601.

In this display apparatus 600, light is emitted from the light-emitting element portion 603 through the circuit element portion 602 toward the substrate 601 and eventually is emitted to an observer side. In addition, light emitted from the light-emitting element portion 603 toward an opposite side of the substrate 601 is reflected by the cathode 604, and thereafter passes through the circuit element portion 602 and the substrate 601 to be emitted to the observer side.

An underlayer protective film 606 formed of a silicon oxide film is arranged between the circuit element portion 602 and the substrate 601. Semiconductor films 607 formed of polysilicon oxide films are formed on the underlayer protective film 606 (near the light-emitting element portion 603) in an isolated manner. In each of the semiconductor films 607, a source region 607_a_ and a drain region 607_b_ are formed on the left and right sides thereof, respectively, by high-concentration positive-ion implantation. The center portion of each of the semiconductor films 607 which is not subjected to high-concentration positive-ion implantation serves as a channel region 607_c_.

In the circuit element portion 602, the underlayer protective film 606 and a transparent gate insulating film 608 covering the semiconductor films 607 are formed. Gate electrodes 609 formed of, for example, Al, Mo, Ta, Ti, or W are disposed on the gate insulating film 608 so as to correspond to the channel regions 607_c_ of the semiconductor films 607. A first transparent interlayer insulating film 611_a_ and a second transparent interlayer insulating film 611_b_ are formed on the gate electrodes 609 and the gate insulating film 608. Contact holes 612_a_ and 612_b_ are formed so as to penetrate the first interlayer insulating film 611_a_ and the second interlayer insulating film 611_b_ and to be connected to the source region 607_a_ and the drain region 607_b_ of the semiconductor films 607.

Pixel electrodes 613 which are formed of ITOs, for example, and which are patterned to have a predetermined shape are formed on the second interlayer insulating film 611_b_. The pixel electrode 613 is connected to the source region 607_a_ through the contact holes 612_a_.

Power source lines 614 are arranged on the first interlayer insulating film 611_a_. The power source lines 614 are connected through the contact holes 612_b_ to the drain region 607_b_.

As shown in FIG. 16, the circuit element portion 602 includes thin-film transistors 615 connected to drive the respective pixel electrodes 613.

The light-emitting element portion 603 includes a functional layers 617 each formed on a corresponding one of pixel electrodes 613, and bank portions 618 which are formed between the pixel electrodes 613 and the functional layers 617 and which are used to partition the functional layers 617 from one another.

The pixel electrodes 613, the functional layers 617, and the cathode 604 formed on the functional layers 617 constitute the light-emitting element. Note that the pixel electrodes 613 are formed into a substantially rectangular shape in plan view by patterning, and the bank portions 618 are formed so that each two of the pixel electrodes 613 sandwich a corresponding one of the bank portions 618.

Each of the bank portions 618 includes an inorganic bank layer 618_a_ (first bank layer) formed of an inorganic material such as SiO, $SiO_2$, or $TiO_2$, and an organic bank layer 618_b_ (second bank layer) which is formed on the inorganic bank layer 618_a_ and has a trapezoidal shape in a sectional view. The organic bank layer 618_b_ is formed of a resist, such as an acrylic resin or a polyimide resin, which has an excellent heat resistance and an excellent lyophobic characteristic. A part of each of the bank portions 618 overlaps peripheries of corresponding two of the pixel electrodes 613 which sandwich each of the bank portions 618.

Openings 619 are formed between the bank portions 618 so as to gradually increase in size upwardly against the pixel electrodes 613.

Each of the functional layers 617 includes a positive-hole injection/transport layer 617_a_ formed so as to be laminated on the pixel electrodes 613 and a light-emitting layer 617_b_ formed on the positive-hole injection/transport layer 617_a_. Note that another functional layer having another function may be arranged so as to be arranged adjacent to the light-emitting layer 617_b_. For example, an electronic transport layer may be formed.

The positive-hole injection/transport layer 617_a_ transports positive holes from a corresponding one of the pixel electrodes 613 and injects the transported positive holes to the light-emitting layer 617*b*. The positive-hole injection/transport layer 617*a* is formed by ejection of a first composition (functional liquid) including a positive-hole injection/transport layer forming material. The positive-hole injection/transport layer forming material may be a known material.

The light-emitting layer 617*b* is used for emission of light having colors red (R), green (G), or blue (B), and is formed by ejection of a second composition (functional liquid) including a material for forming the light-emitting layer 617*b* (light-emitting material). As a solvent of the second composition (nonpolar solvent), a known material which is insoluble to the positive-hole injection/transport layer 617*a* is preferably used. Since such a nonpolar solvent is used as the second composition of the light-emitting layer 617*b*, the light-emitting layer 617*b* can be formed without dissolving the positive-hole injection/transport layer 617*a* again.

The light-emitting layer 617*b* is configured such that the positive holes injected from the positive-hole injection/transport layer 617*a* and electrons injected from the cathode 604 are recombined in the light-emitting layer 617*b* so as to emit light.

The cathode 604 is formed so as to cover an entire surface of the light-emitting element portion 603, and in combination with the pixel electrodes 613, supplies current to the functional layers 617. Note that a sealing member (not shown) is arranged on the cathode 604.

Steps of manufacturing the display apparatus 600 will now be described with reference to FIGS. 17 to 25.

As shown in FIG. 17, the display apparatus 600 is manufactured through a bank portion forming step (S111), a surface processing step (S112), a positive-hole injection/transport layer forming step (S113), a light-emitting layer forming step (S114), and a counter electrode forming step (S115). Note that the manufacturing steps are not limited to these examples shown in FIG. 17, and one of these steps may be omitted or another step may be added according as desired.

Figure 18:
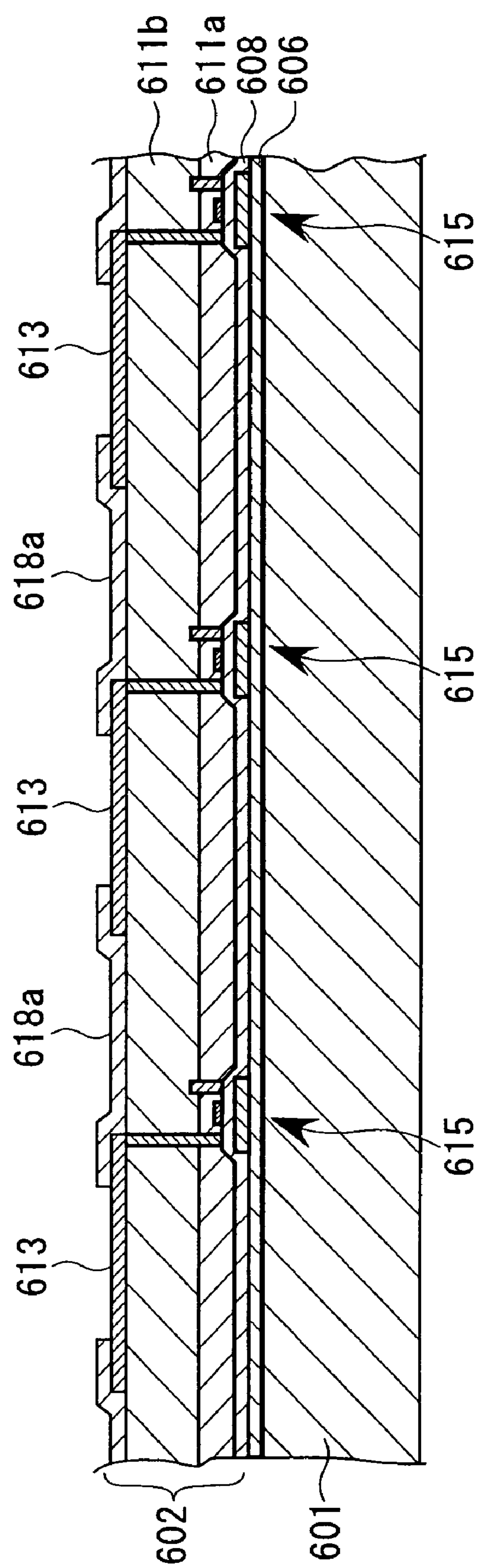
FIG. 18 is a process chart illustrating formation of an inorganic bank layer.

In the bank portion forming step (S111), as shown in FIG. 18, the inorganic bank layers 618*a* are formed on the second interlayer insulating film 611*b*. The inorganic bank layers 618*a* are formed by forming an inorganic film at a desired position and by patterning the inorganic film by the photolithography technique. At this time, a part of each of the inorganic bank layers 618*a* overlaps peripheries of corresponding two of the pixel electrodes 613 which sandwich each of the inorganic bank layers 618*a*.

After the inorganic bank layers 618*a* are formed, as shown in FIG. 19, the organic bank layers 618*b* are formed on the inorganic bank layers 618*a*. As with the inorganic bank layers 618*a*, the organic bank layers 618*b* are formed by patterning a formed organic film by the photolithography technique.

The bank portions 618 are thus formed. When the bank portions 618 are formed, the openings 619 opening upward relative to the pixel electrodes 613 are formed between the bank portions 618. The openings 619 define pixel areas.

In the surface processing step (S112), a hydrophilic treatment and a repellency treatment are performed. The hydrophilic treatment is performed on first lamination areas 618*aa* of the inorganic bank layers 618*a* and electrode surfaces 613*a* of the pixel electrodes 613. The hydrophilic treatment is performed, for example, by plasma processing using oxide as a processing gas on surfaces of the first lamination areas 618*aa* and the electrode surfaces 613*a* to have hydrophilic properties. By performing the plasma processing, the ITO forming the pixel electrodes 613 is cleaned.

The repellency treatment is performed on walls 618*s* of the organic bank layers 618*b* and upper surfaces 618*t* of the organic bank layers 618*b*. The repellency treatment is performed as a fluorination treatment, for example, by plasma processing using tetrafluoromethane as a processing gas on the walls 618*s* and the upper surfaces 618*t*.

By performing this surface processing step, when the functional layers 617 is formed using the functional liquid droplet ejection heads 17, the functional liquid droplets are ejected onto the pixel areas with high accuracy. Furthermore, the functional liquid droplets attached onto the pixel areas are prevented from flowing out of the openings 619.

A display apparatus body 600A is obtained through these steps. The display apparatus body 600A is mounted on the set table 21 of the liquid droplet ejection apparatus 1 shown in FIG. 1 and the positive-hole injection/transport layer forming step (S113) and the light-emitting layer forming step (S114) are performed thereon.

As shown in FIG. 20, in the positive-hole injection/transport layer forming step (S113), the first compositions including the material for forming a positive-hole injection/transport layer are ejected from the functional liquid droplet ejection heads 17 into the openings 619 included in the pixel areas. Thereafter, as shown in FIG. 21, drying processing and a thermal treatment are performed to evaporate polar solution included in the first composition whereby the positive-hole injection/transport layers 617*a* are formed on the pixel electrodes 613 (electrode surface 613*a*).

The light-emitting layer forming step (S114) will now be described. In the light-emitting layer forming step, as described above, a nonpolar solvent which is insoluble to the positive-hole injection/transport layers 617*a* is used as the solvent of the second composition used at the time of forming the light-emitting layer in order to prevent the positive-hole injection/transport layers 617*a* from being dissolved again.

On the other hand, since each of the positive-hole injection/transport layers 617*a* has low affinity to a nonpolar solvent, even when the second composition including the nonpolar solvent is ejected onto the positive-hole injection/transport layers 617*a*, the positive-hole injection/transport layers 617*a* may not be brought into tight contact with the light-emitting layers 617*b* or the light-emitting layers 617*b* may not be uniformly applied.

Accordingly, before the light-emitting layers 617*b* are formed, surface processing (surface improvement processing) is preferably performed so that each of the positive-hole injection/transport layers 617*a* has high affinity to the nonpolar solvent and to the material for forming the light-emitting layers. The surface processing is performed by applying a solvent the same as or similar to the nonpolar solvent of the second composition used at the time of forming the light-emitting layers on the positive-hole injection/transport layers 617*a* and by drying the applied solvent.

Employment of this surface processing allows the surface of the positive-hole injection/transport layers 617*a* to have high affinity to the nonpolar solvent, and therefore, the second composition including the material for forming the light-emitting layers can be uniformly applied to the positive-hole injection/transport layers 617*a* in the subsequent step.

Figure 22:
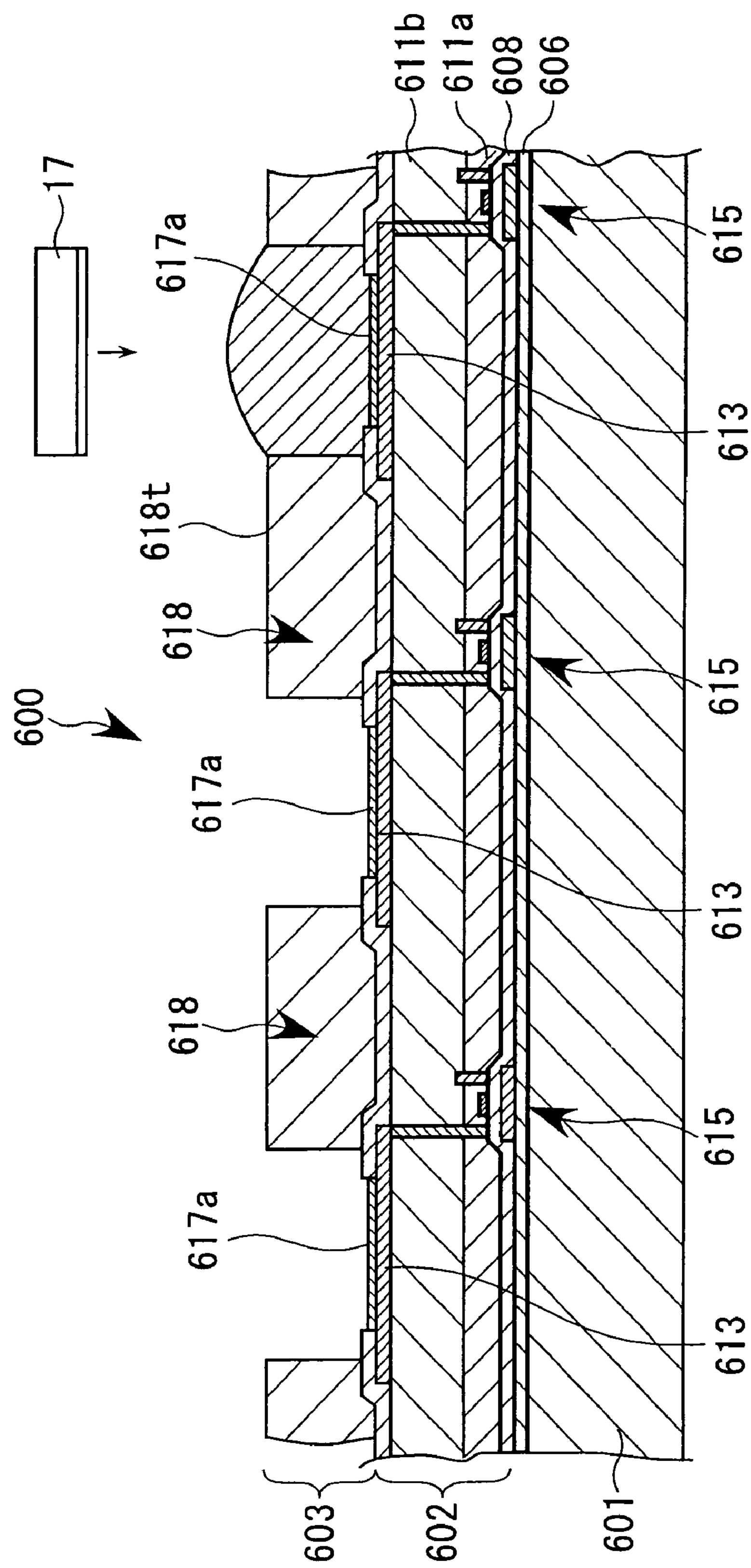
FIG. 22 is a process chart illustrating processes for forming a light-emitting layer having a blue color component.

As shown in FIG. 22, a predetermined amount of second composition including the material for forming the light-emission layers of one of the three colors (blue color (B) in an example of FIG. 22) is ejected into the pixel areas (openings 619) as functional liquid. The second composition ejected into the pixel areas spreads over the positive-hole injection/transport layer 617*a* and fills the openings 619. Note that, even if the second composition is ejected and attached to the upper surfaces 618*t* of the bank portions 618 which are outside of the pixel area, since the repellency treatment has been performed on the upper surfaces 618*t* as described above, the second component easily drops into the openings 619.

Figure 23:
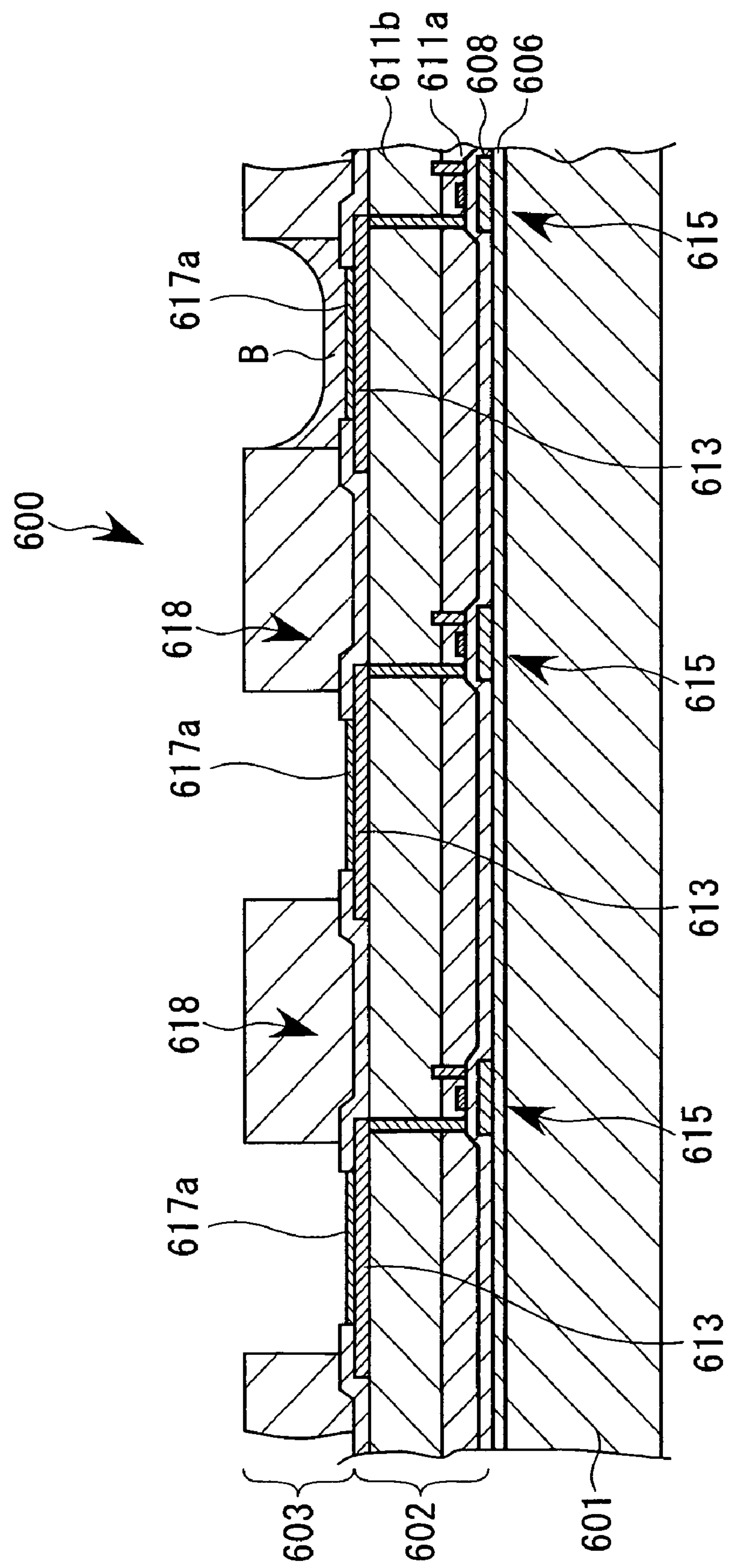
FIG. 23 is a process chart illustrating a state where the light-emitting layer having a blue color component has been formed.

Thereafter, the drying processing is performed so that the ejected second composition is dried and the nonpolar solvent included in the second composition is evaporated whereby the light-emitting layers 617*b* are formed on the positive-hole injection/transport layers 617*a* as shown in FIG. 23. In FIG. 23, one of the light-emitting layers 617*b* corresponding to the blue color (B) is formed.

Similarly, as shown in FIG. 24, a step similar to the above-described step of forming the light-emitting layers 617*b* corresponding to the blue color (B) is repeatedly performed by using functional liquid droplet ejection heads 17 so that the light-emitting layers 617*b* corresponding to other colors (red (R) and green (G)) are formed. Note that the order of formation of the light-emitting layers 617*b* is not limited to the order described above as an example, and any other orders may be applicable. For example, an order of forming the light-emitting layers 617*b* may be determined in accordance with a light-emitting layer forming material. Furthermore, the color scheme pattern of the three colors R, G, and B may be the tripe arrangement, the mosaic arrangement, or the delta arrangement.

As described above, the functional layers 617, that is, the positive-hole injection/transport layers 617*a* and the light-emitting layers 617*b* are formed on the pixel electrodes 613. Then, the process proceeds to the counter electrode forming step (S115).

In the counter electrode forming step (S115), as shown in FIG. 25, the cathode (counter electrode) 604 is formed on entire surfaces of the light-emitting layers 617*b* and the organic bank layers 618*b* by an evaporation method, sputtering, or a CVD (chemical vapor deposition) method, for example. The cathode 604 is formed by laminating a calcium layer and an aluminum layer, for example, in this embodiment.

An Al film and a Ag film as electrodes and a protective layer formed of $SiO_2$ or SiN for preventing the Al film and the Ag film from being oxidized are formed on the cathode 604.

After the cathode 604 is thus formed, other processes such as sealing processing of sealing a top surface of the cathode 604 with a sealing member and wiring processing are performed whereby the display apparatus 600 is obtained.

FIG. 26 is an exploded perspective view of an essential part of a plasma display apparatus (PDP apparatus: hereinafter simply referred to as a display apparatus 700). Note that, in FIG. 26, the display apparatus 700 is partly cut away.

The display apparatus 700 includes a first substrate 701, a second substrate 702 which faces the first substrate 701, and a discharge display portion 703 interposed therebetween. The discharge display portion 703 includes a plurality of discharge chambers 705. The discharge chambers 705 include red discharge chambers 705R, green discharge chambers 705G, and blue discharge chambers 705B, and are arranged so that one of the red discharge chambers 705R, one of the green discharge chambers 705G, and one of the blue discharge chambers 705B constitute one pixel as a group.

Address electrodes 706 are arranged on the first substrate 701 with predetermined intervals therebetween in a stripe pattern, and a dielectric layer 707 is formed so as to cover top surfaces of the address electrodes 706 and the first substrate 701. Partition walls 708 are arranged on the dielectric layer 707 so as to be arranged along with the address electrodes 706 in a standing manner between the adjacent address electrodes 706. Some of the partition walls 708 extend in a width direction of the address electrodes 706 as shown in FIG. 26, and the others (not shown) extend perpendicular to the address electrodes 706.

Regions partitioned by the partition walls 708 serve as the discharge chambers 705.

The discharge chambers 705 include respective fluorescent substances 709. Each of the fluorescent substances 709 emits light having one of the colors of red (R), green (G) and blue (B). The red discharge chamber 705R has a red fluorescent substance 709R on its bottom surface, the green discharge chamber 705G has a green fluorescent substance 709G on its bottom surface, and the blue discharge chamber 705B has a blue fluorescent substance 709B on its bottom surface.

On a lower surface of the second substrate 72 in FIG. 26, a plurality of display electrodes 711 are formed with predetermined intervals therebetween in a stripe manner in a direction perpendicular to the address electrodes 706. A dielectric layer 712 and a protective film 713 formed of MgO, for example, are formed so as to cover the display electrodes 711.

The first substrate 701 and the second substrate 702 are attached so that the address electrodes 706 are arranged perpendicular to the display electrodes 711. Note that the address electrodes 706 and the display electrodes 711 are connected to an alternate power source (not shown).

When the address electrodes 706 and the display electrodes 711 are brought into conduction states, the fluorescent substances 709 are excited and emit light whereby display with colors is achieved.

In this embodiment, the address electrodes 706, the display electrodes 711, and the fluorescent substances 709 may be formed using the liquid droplet ejection apparatus 1 shown in FIG. 1. Steps of forming the address electrodes 706 on the first substrate 701 are described hereinafter.

The steps are performed in a state where the first substrate 701 is mounted on the set table 21 on the liquid droplet ejection apparatus 1.

The functional liquid droplet ejection heads 17 eject a liquid material (functional liquid) including a material for forming a conducting film wiring as functional droplets to be attached onto regions for forming the address electrodes 706. The material for forming a conducting film wiring included in the liquid material is formed by dispersing conductive fine particles such as those of a metal into dispersed media. Examples of the conductive fine particles include a metal fine particle including gold, silver, copper, palladium, or nickel, and a conductive polymer.

When ejection of the liquid material onto all the desired regions for forming the address electrodes 706 is completed, the ejected liquid material is dried, and the disperse media included in the liquid material is evaporated whereby the address electrodes 706 are formed.

Although the steps of forming the address electrodes 706 are described as an example above, the display electrodes 711 and the fluorescent substances 709 may be formed by the steps described above.

In a case where the display electrodes 711 are formed, as with the address electrodes 706, a liquid material (functional liquid) including a material for forming a conducting film wiring is ejected from the functional liquid droplet ejection heads 17 as liquid droplets to be attached to the areas for forming the display electrodes.

In a case where the fluorescent substances 709 are formed, a liquid material including fluorescent materials corresponding to three colors (R, G, and B) is ejected as liquid droplets from the functional liquid droplet ejection heads 17 so that liquid droplets having the three colors (R, G, and B) are attached within the discharge chambers 705.

FIG. 27 shows a sectional view of an essential part of an electron emission apparatus (also referred to as a FED apparatus or a SED apparatus: hereinafter simply referred to as a display apparatus 800). In FIG. 27, a part of the display apparatus 800 is shown in the sectional view.

The display apparatus 800 includes a first substrate 801, a second substrate 802 which faces the first substrate 801, and a field-emission display portion 803 interposed therebetween. The field-emission display portion 803 includes a plurality of electron emission portions 805 arranged in a matrix.

First element electrodes 806*a* and second element electrodes 806*b*, and conductive films 807 are arranged on the first substrate 801. The first element electrodes 806*a* and the second element electrodes 806*b* intersect with each other. Cathode electrodes 806 are formed on the first substrate 801, and each of the cathode electrodes 806 is constituted by one of the first element electrodes 806*a* and one of the second element electrodes 806*b*. In each of the cathode electrodes 806, one of the conductive films 807 having a gap 808 is formed in a portion formed by the first element electrode 806*a* and the second element electrode 806*b*. That is, the first element electrodes 806*a*, the second element electrodes 806*b*, and the conductive films 807 constitute the plurality of electron emission portions 805. Each of the conductive films 807 is constituted by palladium oxide (PdO). In each of the cathode electrodes 806, the gap 808 is formed by forming processing after the corresponding one of the conductive films 807 is formed.

An anode electrode 809 is formed on a lower surface of the second substrate 802 so as to face the cathode electrodes 806. A bank portion 811 is formed on a lower surface of the anode electrode 809 in a lattice. Fluorescent materials 813 are arranged in opening portions 812 which opens downward and which are surrounded by the bank portion 811. The fluorescent materials 813 correspond to the electron emission portions 805. Each of the fluorescent materials 813 emits fluorescent light having one of the three colors, red (R), green (G), and blue (B). Red fluorescent materials 813R, green fluorescent materials 813G, and blue fluorescent materials 813B are arranged in the opening portions 812 in a predetermined arrangement pattern described above.

The first substrate 801 and the second substrate 802 thus configured are attached with each other with a small gap therebetween. In this display apparatus 800, electrons emitted from the first element electrodes 806*a* or the second element electrodes 806*b* included in the cathode electrodes 806 hit the fluorescent materials 813 formed on the anode electrode 809 so that the fluorescent materials 813 are excited and emit light whereby display with colors is achieved.

As with the other embodiments, in this case also, the first element electrodes 806*a*, the second element electrodes 806*b*, the conductive films 807, and the anode electrode 809 may be formed using the liquid droplet ejection apparatus 1. In addition, the red fluorescent materials 813R, the green fluorescent materials 813G, and the blue fluorescent materials 813B may be formed using the liquid droplet ejection apparatus 1.

Figure 28A:
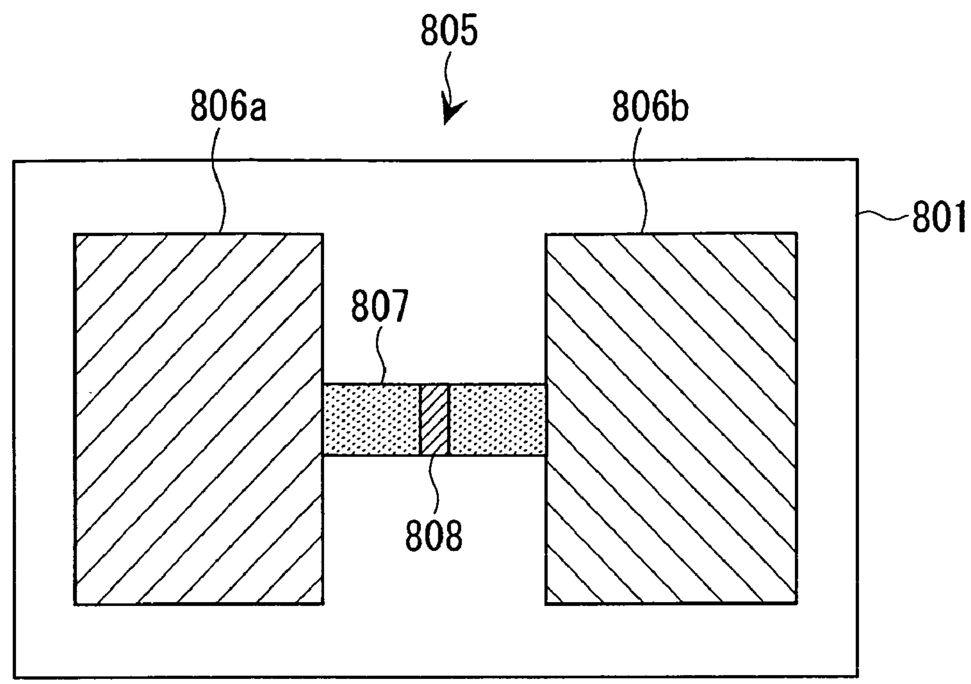
FIG. 28A is a plan view illustrating an electron emission portion and the vicinity thereof of a display apparatus.
Figure 28B:
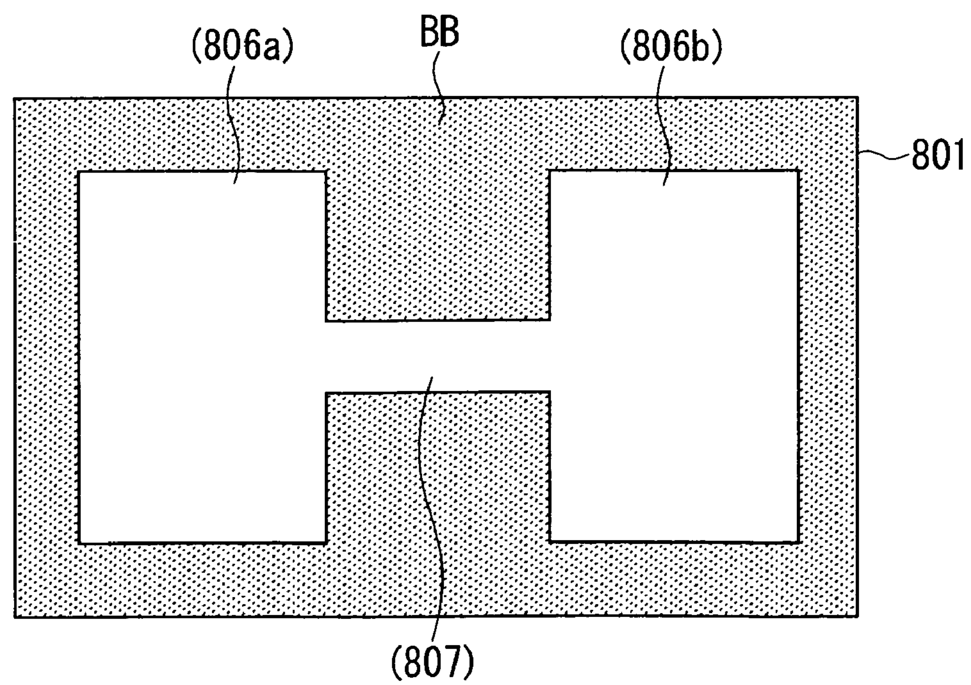
FIG. 28B is a plan view illustrating a method of forming the electron emission portion and the vicinity thereof.

Each of the first element electrodes 806*a*, each of the second element electrodes 806*b*, and each of the conductive films 807 have shapes as shown in FIG. 28A. When the first element electrodes 806*a*, the second element electrodes 806*b*, and the conductive films 807 are formed, portions for forming the first element electrodes 806*a*, the second element electrodes 806*b*, and the conductive films 807 are left as they are on the first substrate 801 and only bank portions BB are formed (by a photolithography method) as shown in FIG. 28B. Then, the first element electrodes 806*a* and the second element electrodes 806*b* are formed by an inkjet method using a solvent ejected from the liquid droplet ejection apparatus 1 in grooves defined by the bank portions BB and are formed by drying the solvent. Thereafter, the conductive films 807 are formed by the inkjet method using the liquid droplet ejection apparatus 1. After forming the conductive films 807, the bank portions BB are removed by ashing processing and the forming processing is performed. Note that, as with the case of the organic EL device, the hydrophilic treatment is preferably performed on the first substrate 801 and the second substrate 802 and the repellency treatment is preferably performed on the bank portion 811 and the bank portions BB.

Examples of other electro-optical apparatuses include an apparatus for forming metal wiring, an apparatus for forming a lens, an apparatus for forming a resist, and an apparatus for forming an optical diffusion body. Use of the liquid droplet ejection apparatus 1 makes it possible to efficiently manufacture various electro-optical apparatuses.

What is claimed is:

1. A functional liquid supply apparatus comprising:

a plurality of sub tanks which supply functional liquid to a plurality of ink jet type functional liquid droplet ejection heads via a head side channel respectively, a tank unit which replenishes the functional liquid to the plurality of sub tanks by pressurized liquid feeding, a functional liquid channel having a main channel of which an upstream side is connected to the tank unit, a branch channel of which an upstream side is connected to the main channel, and a plurality of branching channels of which an upstream side is connected to the branch channel and a downstream side is connected to each of the sub tanks, a plurality of branching channel opening and closing devices which is provided on each of the branching channels and replenishes the pressurized functional liquid fed from the tank unit to each of the sub tanks by opening and closing action, and a liquid feeding control device which controls the tank unit, the tank unit including:

a pair of main tanks which stores the functional liquid;

a liquid pressurizing and feeding device connected to the pair of the main tanks;

a switching device having a pair of tank channels of which an upstream side is connected to the pair of the main tanks and a downstream side is connected to the main channel and a pair of tank opening and closing valves interposed in each tank channel, and which is capable of switching the pressurized liquid of the functional liquid fed from the pair of the main tanks alternatively, a pair of weight measuring apparatuses which measure a weight of each main tank, and a pair of bubble detection sensors discretely provided on each tank channel and detecting a bubble in the functional liquid flowing in each tank channel, wherein the liquid feeding control device makes the switching device switch from one main tank side to the other main tank side when the functional liquid of the one main tank is consumed to a predetermined weight and the bubble is detected in a corresponding one tank channel based on measurement results of the pair of weight measuring apparatus and detection results of the pair of bubble detection sensors.

2. The functional liquid supply apparatus according to claim 1, wherein each of the branching channel opening and closing device is constructed with an air-operated valve which is capable of opening and closing each of the branching channels without changing a volume therein.

3. The functional liquid supply apparatus according to claim 1, wherein each of the sub tanks is disposed at a position above the corresponding functional liquid droplet ejection head, a decompression valve is provided on each of the head side main channels, the decompression valve operating at an atmosphere pressure criteria and retaining a head pressure between the corresponding functional liquid droplet ejection head within a predetermined allowable range.

4. The functional liquid supply apparatus according to claim 1, further comprising a liquid level controlling device which controls a liquid level of the functional liquid in each of the sub tanks in a replenishing at a center position of an upper and a lower directions.

5. The functional liquid supply apparatus according to claim 1, further comprising a bubble elimination device which is provided on the main channel and eliminates micro bubbles in the functional liquid.

6. The functional liquid supply apparatus according to claim 1, further comprising an air-drawn device provided on an end of the downstream side of the main channel, and an air-drawn channel connected to the air-drawn device.

7. The functional liquid supply apparatus according to claim 1, further comprising:

a sub pressurizing device which is connected to each of the sub tanks and is capable of pressurizing within each of the sub tanks, a head channel opening and closing device which is provided on each of the head side channels and is capable of opening and closing therefor, an upper limit detection device which detects the liquid level at which the functional liquid reaches an upper limit of each of the sub tanks, and a liquid feeding control device which controls the liquid pressurizing and feeding device, each of the sub pressurizing devices, each of the branching channel opening and closing devices and each of the head channel opening and closing devices, the liquid feeding control device, when the upper limit detection device detects the liquid level at which the functional liquid reaches the upper limit of each of the sub tanks, makes the branching channel opening and closing device open, makes the head channel opening and closing device closed, releases a pressure of the liquid pressurizing and feeding device, and feeds the functional liquid of the sub tank reversely to the main tank by driving the sub pressurizing device.

8. The functional liquid supply apparatus according to claim 1, wherein the branch channel is constructed with a two-branch joint and a pair of connecting short pipes, which is repeated a plurality of stages from an upstream side end to a downstream side end, and of which an upstream side thereof is set to a bottom and a downstream side thereof is set to a top.

9. The functional liquid supply apparatus according to claim 8, wherein the branch channel, when a fractional portion remains at a most downstream stage, adjust a pressure loss by a pipe length between the pair of the connecting short pipes at the most downstream stage and the connecting short pipe of an upstream stage thereof.

10. The functional liquid supply apparatus according to claim 8, wherein the branch channel has the two-branch joint and the pair of the connecting short pipes of an uppermost stream stage having larger diameters at least than those of the two-branch joint and the pair of the connecting short pipes of the most downstream stage.

11. The functional liquid supply apparatus according to claim 8, wherein the two-branch joint has a T-shaped joint.

12. A liquid droplet ejection apparatus comprising:

a plotting device which plots with functional liquid droplets ejected from an ink jet type functional liquid droplet ejection head while moving the functional liquid droplet ejection head over a workpiece, and the functional liquid supply apparatus according to claim 1 which supplies the functional liquid to the functional liquid droplet ejection head.

13. The liquid droplet ejection apparatus according to claim 12, further comprising a chamber device which manages an internal atmosphere at a predetermined temperature, wherein the chamber device accommodates the plotting device and the functional liquid supply apparatus except the tank unit which is disposed an outside therefrom.

14. A method of manufacturing an electro-optical device which forms a film on the workpiece with the functional liquid droplet by using the liquid droplet ejection apparatus according to claim 12.

15. An electro-optical device which forms a film on the workpiece with the functional liquid droplet by using the liquid droplet ejection device according to claim 12.

16. An electronic device having the electro-optical device according claim 15.

* * * * *